United States Patent
Wong et al.

(10) Patent No.: US 9,990,022 B2
(45) Date of Patent: Jun. 5, 2018

(54) ADAPTIVE POWER MULTIPLEXING WITH A POWER DISTRIBUTION NETWORK

(71) Applicant: QUALCOMM Incorporated, San Diego, CA (US)

(72) Inventors: Mong Chit Wong, San Diego, CA (US); Nam Dang, San Diego, CA (US); Rajeev Jain, San Diego, CA (US); Sassan Shahrokhinia, San Diego, CA (US); Yu Huang, San Diego, CA (US); Lipeng Cao, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 113 days.

(21) Appl. No.: 15/199,567

(22) Filed: Jun. 30, 2016

(65) Prior Publication Data

US 2018/0004276 A1 Jan. 4, 2018

(51) Int. Cl.
*G06F 1/26* (2006.01)
*G06F 1/32* (2006.01)

(52) U.S. Cl.
CPC ............ *G06F 1/3234* (2013.01); *G06F 1/263* (2013.01)

(58) Field of Classification Search
None
See application file for complete search history.

(56) References Cited

U.S. PATENT DOCUMENTS

| | | | |
|---|---|---|---|
| 7,038,522 B2 | 5/2006 | Fauh et al. | |
| 7,542,369 B2 | 6/2009 | Kenkare et al. | |
| 7,746,154 B2 | 6/2010 | Merandat et al. | |
| 7,893,560 B2 | 2/2011 | Carter | |
| 8,766,701 B1 | 7/2014 | Sood | |
| 2007/0226557 A1 | 9/2007 | Fuseya | |
| 2014/0097702 A1* | 4/2014 | Upputuri | G11C 5/063 307/115 |
| 2014/0285014 A1 | 9/2014 | Calhoun et al. | |
| 2015/0082069 A1* | 3/2015 | Bose | G06F 1/3287 713/324 |

FOREIGN PATENT DOCUMENTS

| | | |
|---|---|---|
| WO | WO-9610258 A1 | 4/1996 |
| WO | WO-2011026047 A1 | 3/2011 |
| WO | WO-2012137210 A2 | 10/2012 |

OTHER PUBLICATIONS

International Search Report and Written Opinion—PCT/US2017/029669—ISA/EPO—Jul. 27, 2017.

* cited by examiner

*Primary Examiner* — Fahmida Rahman
(74) *Attorney, Agent, or Firm* — Haynes and Boone, LLP

(57) ABSTRACT

An integrated circuit (IC) is disclosed herein for adaptive power multiplexing with a power distribution network. In an example aspect, the integrated circuit includes a first power rail, a second power rail, and a load power rail. The integrated circuit also includes multiple power-multiplexer tiles and power-multiplexer control circuitry. The multiple power-multiplexer tiles are coupled in series in a chained arrangement and configured to jointly perform a power-multiplexing operation. Each power-multiplexer tile is configured to switch between coupling the load power rail to the first power rail and coupling the load power rail to the second power rail. The power-multiplexer control circuitry is configured to control a direction of current flow to prevent cross-conduction between the first power rail and the second power rail during the power-multiplexing operation.

21 Claims, 14 Drawing Sheets

ADAPTIVE POWER MULTIPLEXING WITH A POWER DISTRIBUTION NETWORK

TECHNICAL FIELD

This disclosure relates generally to power management with integrated circuits (ICs) used in electronic devices and, more specifically, to enabling a power source for a circuit to be switched to a lower voltage level to reduce power consumption by the circuit.

BACKGROUND

Power consumption by electronic devices is an increasingly important factor in the design of electronic devices. From a global perspective, the energy consumption of electronic devices occupies a sizable percentage of total energy usage due to large corporate data centers and the ubiquity of personal computing devices. Environmental concerns thus motivate efforts to reduce the power consumed by electronic devices to help conserve the earth's resources. From an individual perspective, less power consumption translates to lower energy bills. Furthermore, many personal computing devices are portable and powered by batteries. The less energy that is consumed by a portable battery-powered electronic device, the longer the portable device may operate without recharging the battery. Lower energy consumption also enables the use of smaller batteries and the adoption of thinner form factors, which means devices can be made more portable or versatile. Thus, the popularity of portable electronic devices also motivates efforts to reduce the power consumption of electronic devices.

An electronic device consumes power if the device is coupled to a power source and is turned on. This is true for the entire electronic device, but it is also true for individual parts of the electronic device. Hence, power consumption can be reduced if parts of an electronic device are powered down, even while other parts remain powered up. Entire discrete components of an electronic device, such as a whole integrated circuit (IC) or a display screen, may be powered down. Alternatively, selected parts of a discrete component may likewise be powered down. For example, a distinct processing entity or a circuit block of an integrated circuit chip, such as a core thereof, may be selectively powered down for some period of time to reduce energy consumption.

A portion of an integrated circuit, such as a core, can therefore be powered down to reduce power usage and extend battery life. A core can be powered down by decoupling the core from a power source or by turning the power source off. Additionally, a core can be powered down by lowering a voltage supplied to the core. One approach to supplying a lower voltage level to cores of an integrated circuit is called dynamic voltage scaling (DVS). With dynamic voltage scaling, power usage by a core can be managed by lowering a supply voltage during times of reduced utilization and then raising the supply voltage to meet higher utilization demands.

Thus, using dynamic voltage scaling as a power management technique with integrated circuits can reduce power consumption of electronic devices. Unfortunately, implementing dynamic voltage scaling is challenging. For example, implementing dynamic voltage scaling can adversely impact a performance level of a core of an integrated circuit, especially during the voltage level transitions. During a voltage level transition for a core, processing throughput can be slowed, and data can be corrupted. These concerns have hindered the deployment of dynamic voltage scaling and consequently prevented the full power-conserving benefits of dynamic voltage scaling from being attained.

SUMMARY

In an example aspect, an integrated circuit is disclosed. The integrated circuit includes a first power rail, a second power rail, and a load power rail. The integrated circuit also includes multiple power-multiplexer tiles and power-multiplexer control circuitry. The multiple power-multiplexer tiles are coupled in series in a chained arrangement and configured to jointly perform a power-multiplexing operation. Each power-multiplexer tile is configured to switch between coupling the load power rail to the first power rail and coupling the load power rail to the second power rail. The power-multiplexer control circuitry is configured to control a direction of current flow to prevent cross-conduction between the first power rail and the second power rail during the power-multiplexing operation.

In an example aspect, an integrated circuit is disclosed. The integrated circuit includes a first power rail, a second power rail, and a load power rail. The integrated circuit also includes multiple power-multiplexer tiles coupled in series in a chained arrangement. The multiple power-multiplexer tiles are configured to perform a power-multiplexing operation including switching between coupling the load power rail to the first power rail and coupling the load power rail to the second power rail. The power-multiplexing operation includes an overlapping phase in which the first power rail and the second power rail are both coupled to the load power rail. The integrated circuit further includes means for preventing cross-conduction between the first power rail and the second power rail during the overlapping phase of the power-multiplexing operation by controlling a direction of current flow.

In an example aspect, a method for adaptive power multiplexing with a power distribution network is disclosed. The method includes providing power to a load power rail from a first power rail via multiple first switching circuits that are distributed along a portion of a circuit load coupled to the load power rail. The method also includes generating a relative voltage signal based on a comparison including a first voltage of the first power rail and a second voltage of a second power rail. The method additionally includes implementing a power rail transition procedure having multiple phases to transition from the first power rail to the second power rail. During at least one phase of the multiple phases, the power rail transition procedure entails controlling a direction of current flow based on the relative voltage signal. The method further includes providing power to the load power rail from the second power rail via multiple second switching circuits that are distributed along the portion of the circuit load.

In an example aspect, an integrated circuit is disclosed. The integrated circuit includes a first power rail, a second power rail, and a load power rail. The first power rail is configured to be held at a first voltage, and the second power rail is configured to be held at a second voltage. The integrated circuit also includes a power-multiplexer tile having four switches. A first big bi-state switch is coupled between the first power rail and the load power rail. A first little tri-state switch is also coupled between the first power rail and the load power rail, with the first little tri-state switch capable of being in a one-way state to permit unidirectional current flow from the first power rail to the load power rail and to prevent unidirectional current flow from the load power rail to the first power rail. A second big bi-state switch is coupled between the second power rail and the load power rail. A second little tri-state switch is also coupled between the second power rail and the load power rail, with the second little tri-state switch capable of being in the one-way state to permit unidirectional current flow from the second power rail to the load power rail and to prevent unidirectional current flow from the load power rail to the second power rail. The integrated circuit further includes power-multiplexer control circuitry configured to place the first little tri-state switch or the second little tri-state switch in the one-way state based on a comparison including the first voltage and the second voltage during a power-multiplexing operation to switch between coupling the load power rail to the first power rail and coupling the load power rail to the second power rail.

DETAILED DESCRIPTION

Figure 1:
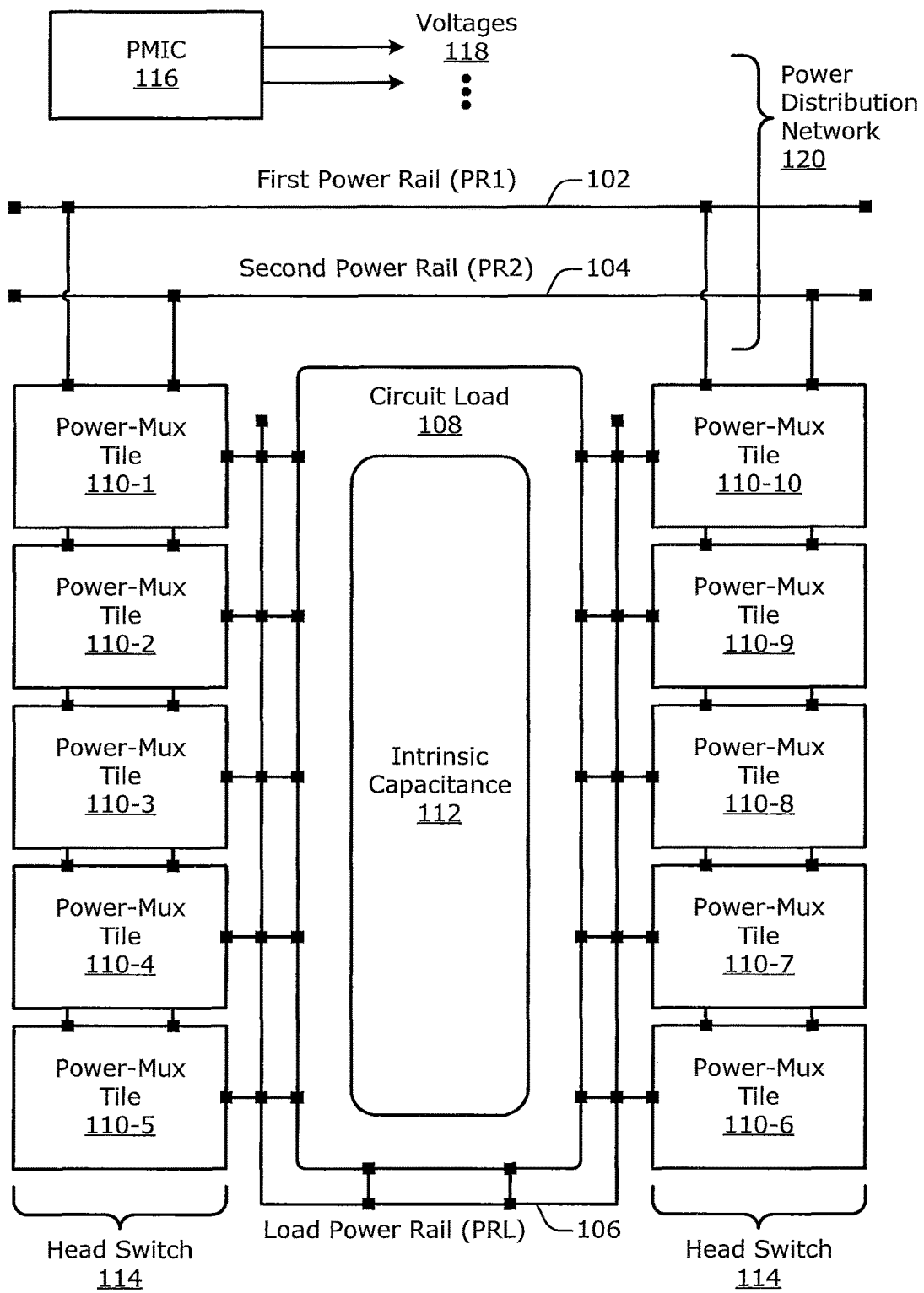
FIG. 1 illustrates an example portion of an integrated circuit that includes multiple power-multiplexer tiles (power-mux tiles) and a circuit load.

Power management of electronic devices entails controlling an amount of energy that an integrated circuit (IC) consumes over time or on an instantaneous basis. Energy consumption can be reduced to zero or near zero during times of nonuse if an integrated circuit is powered down completely. At times of lower utilization or to retain some stored data, an integrated circuit may be powered down to a lower voltage level to reduce power consumption. Also, if an integrated circuit cannot be powered down as a whole, then one or more portions, or cores, may be powered down independently of one another.

An example power management technique is power multiplexing. Power multiplexing may be utilized to provide power reduction opportunities during operation of an integrated circuit. With power multiplexing, an integrated circuit portion, such as a core, is switched from being powered at one voltage level to being powered at another voltage level. Generally, a given core of an integrated circuit consumes less energy if operated at a lower voltage level. Thus, power consumption of an integrated circuit can be reduced by switching a core to a lower voltage level.

In an example context, a graphics processing unit (GPU) operates in conjunction with a cache memory that stores graphical data. If an integrated circuit chip including the GPU is waiting for additional data or user input before changing a display on a screen, a core corresponding to the GPU may be powered down completely. The cache memory, however, cannot be powered down completely if stored graphical data is to be subsequently used because the graphical data is lost if power is removed from the cache memory. Nevertheless, a supply voltage for the cache memory of the GPU may be lowered to a level that is sufficient to maintain the graphical data but likely insufficient to enable satisfactory storage/retrieval operations to be performed by the cache memory. This lowered level of the supply voltage still reduces the power consumed by the cache memory while the GPU is powered down completely. One way to lower the supply voltage for the cache memory is to use power multiplexing techniques to switch a core including the cache memory from one power rail held at one voltage level to another power rail held at another, lower voltage level.

For power multiplexing generally, a circuit load is multiplexed between multiple power rails with one power rail being held at a voltage level that is lower than that of the other power rail or rails. The multiplexing between multiple different power rails is accomplished using one or more power-multiplexer tiles. With two power rails, for example, each power-multiplexer tile includes two switches, such as two switching transistors, with each switch coupled to one of the two power rails. A power-multiplexing operation entails disconnecting the circuit load from one power rail and connecting the circuit load to another power rail using the two switching transistors in an orderly switching process. If the circuit load occupies a large area of an integrated circuit chip, multiple power-multiplexer tiles are distributed at different physical locations over the chip to meet current-resistance (IR) drop requirements and to deliver power to different areas of the chip, as will be appreciated by the skilled artisan.

Employing distributed power-multiplexer tiles does enable switching between two different power rails to change voltage levels and therefore reduce power consumption over a large area of an integrated circuit. Unfortunately, power-multiplexing scenarios involving distributed power-multiplexer tiles introduce a number of competing problems. First, cross-conduction between two different power rails results in an unnecessary expenditure of power that wastes energy. For example, two different switching transistors coupled to two different power rails of arbitrary voltages cannot both be on at the same time without risking the development of a short-circuit current between the two different power rails, especially if the two different switching transistors are close to one another, such as by being part of the same power-multiplexer tile. If two switching transistors that are coupled to two different power rails are both on, current may flow from a higher-voltage power rail through one of the switching transistors to a common node of a load power rail. From the common node, the current continues by flowing through the other switching transistor to the lower-voltage power rail. A significant amount of power can be drained by a short-circuit current if the short-circuit current condition persists. Moreover, the short-circuit current can be sufficiently strong so as to jeopardize the reliability, or even the viability, of the switching transistors.

With regard to a second competing problem with power-multiplexing operations, the switching transistors of the distributed power-multiplexer tiles that are coupled to the two different power rails cannot all be off simultaneously for an extended period of time. If all of the transistors are simultaneously off, the circuit load no longer receives power. As a result, there is an undesirable voltage drop in the circuit load caused by the load current discharging the intrinsic capacitance of the load. This discharging jeopardizes the retention of any data stored in the circuit load and can harm ongoing processing efforts. Third, if the circuit load is to continue processing during a power-multiplexing operation, the circuit load continues to rely on a periodic clock signal. Disconnecting the circuit load from both power rails is therefore inadvisable because clock pulses cannot be reliably distributed around the circuit load without supplying some amount of power.

Fourth, a power-multiplexing operation can include a disconnection portion pertaining to an origin power rail and a connection portion pertaining to a destination power rail. A connection portion can cause a voltage droop in the destination power rail. Multiple switching transistors are coupled to a given power rail and distributed around a circuit load at multiple power-multiplexer tiles. If all, or just too many, of the multiple switching transistors are turned on simultaneously, too much current flows into the circuit load from the given power rail, which causes the voltage level on the voltage rail to droop. The voltage droop causes other cores that are also coupled to the power rail to function incorrectly. Handling multiple ones of these four competing problems, especially over a large physical area, is challenging.

These four problems can be restated as a cross-conduction concern (the first problem), a non-conduction concern (the second and third problems), and an over-conduction concern due to current in-rush (the fourth problem). To at least partially address these problems, a power-multiplexing operation that is directed to a power rail transition procedure having multiple phases is described herein. The power rail transition procedure entails switching a circuit load from an origin power rail to a destination power rail. Associated power-multiplexer control circuitry includes a capability to control a direction of current flow during the power-multiplexing operation. Accordingly, the power-multiplexer control circuitry institutes an overlapping phase during the power rail transition procedure in which a circuit load can receive power from multiple power rails simultaneously without risking an appreciable cross-conduction current and thereby enable a continuous provision of power. Additionally, a phase includes a sequential switching along a chain of power-multiplexer tiles to gradually draw an increasing amount of current from a destination power rail to manage current in-rush.

In one or more example embodiments, multiple power-multiplexer tiles are distributed along at least one side of a circuit load. The circuit load is coupled to a load power rail and can be multiplexed to different power rails being held at different voltage levels. Power-multiplexing control circuitry and the multiple power-multiplexer tiles jointly perform a power-multiplexing operation. The power-multiplexing control circuitry includes a comparator to determine which power rail has a lower voltage level to adapt the power-multiplexing operation based on signal indicative of the power rail having a relatively lower voltage level.

Each power-multiplexer tile of the multiple power-multiplexer tiles includes a first switching circuit coupled between a first power rail and the load power rail and a second switching circuit coupled between a second power rail and the load power rail. Each power-multiplexer tile also includes a tile control circuit to control operation of the first switching circuit and the second switching circuit. At least one of the first switching circuit and the second switching circuit is continuously providing power during the power-multiplexing operation so that correct operation of the circuit is not jeopardized, even if a periodic clock signal is applied to the circuit load during the power-multiplexing operation. To counteract a potential voltage droop on a destination power rail, current in-rush is managed by sequentially activating switching circuits that are coupled to the destination power rail along a chained series of the multiple power-multiplexer tiles.

Each switching circuit of a power-multiplexer tile can be placed in a current-flow mode selected from an off mode, an on mode, and a one-way mode. The switching circuit bi-directionally blocks current flow in the off mode and bi-directionally enables current flow in the on mode. In the one-way mode, the switching circuit permits unidirectional current flow but prevents bi-directional current flow. To prevent an appreciable short-circuit current condition between two different power rails, a direction of current flow is controlled by selectively activating the one-way current-flow mode. If both the first switching circuit and the second switching circuit are simultaneously permitting a current flow, the tile control circuit places one of the two switching circuits in the one-way mode to prevent a current flow toward the corresponding power rail to which the switching circuit is coupled. For example, the tile control circuit places the switching circuit that is coupled to the power rail having the lower voltage level, as determined by the comparator, in the one-way current-flow mode to prevent current from flowing toward the lower voltage power rail.

In some implementations, each switching circuit includes a big switch and a little switch coupled in parallel. The little switch is realized operationally as a diode-type device using a transistor that is selectively connectable in a diode configuration. If a switching circuit is coupled to a lower voltage power rail, the little switch can be activated as a diode while the big switch is switched off to place the switching circuit in a one-way mode that permits unidirectional current flow. The little switches of the first switching circuits or of the second switching circuits, which are disposed across multiple power-multiplexer tiles, are placed in an on state or a one-way state in a sequential manner to provide power gradually along the circuit load during the power rail transition procedure. This manages the potential current in-rush as the circuit load absorbs increasing amounts of current from the destination power rail. After the little switches have entered the on state for a destination power rail, the power-multiplexing control circuitry turns on the big switches for the destination power rail to enable a greater current flow into the circuit load for ongoing power delivery.

In these manners, various implementations described herein address the four problems set forth above. More specifically, an example power-multiplexing operation uses power-multiplexer tiles having a capability to control a direction of current to combat the cross-conduction concern. By preventing appreciable cross-conduction using a switching device that permits one-way current flow but prevents bi-directional current flow, the power rail transition procedure can provide at least some amount of power continuously during the power-multiplexing operation to handle the non-conduction concern. Additionally, a phase of the power rail transition procedure sequentially couples a circuit load to a destination power rail across a chained series of power-multiplexer tiles to gradually draw increasing amounts of current from the destination power rail. This incremental coupling ameliorates current in-rush to address the over-conduction concern.

FIG. 1 illustrates an example portion of an integrated circuit 100 that includes multiple power-multiplexer tiles 110-1 to 110-10, or multiple power-mux tiles, and a circuit load 108. As shown, the integrated circuit 100 includes three power rails: a first power rail 102 (PR1), a second power rail 104 (PR2), and a load power rail 106 (PRL). The integrated circuit 100 also includes the circuit load 108, an intrinsic capacitance 112, and a head switch 114, with the head switch 114 including the ten power-multiplexer tiles 110-1 to 110-10. The circuit load 108 may correspond to a core, or circuit block, of the integrated circuit 100. The intrinsic capacitance 112 represents capacitive effects resulting from an architecture or a material used to construct circuit devices of the circuit load 108. For example, metal lines and transistors typically have or generate an intrinsic capacitance. Although the intrinsic capacitance 112 is illustrated as a monolithic block in FIG. 1, the intrinsic capacitance 112 is actually distributed across the circuit area of the circuit load 108.

The first power rail 102 and the second power rail 104 are held at different voltages by a power management integrated circuit 116 (PMIC). The power management integrated circuit 116 may be part of or separate from the integrated circuit 100. In other words, the power management integrated circuit 116 may be on the same or a different integrated circuit chip. The power management integrated circuit 116 is implemented as a voltage source to supply voltages 118 to power rails at specified voltage levels through voltage conversion or regulation. One or more power rails form at least part of a power distribution network 120 (PDN) that distributes power to different locations and various circuitry around the integrated circuit 100. The power distribution network 120 may include the power management integrated circuit 116.

Generally, a head switch is connected between a power supply rail that is serving as a voltage source and a circuit load that is performing digital processing to provide some functionality. For the integrated circuit 100, the head switch 114 is connected between the first power rail 102 and the circuit load 108 and between the second power rail 104 and the circuit load 108. The head switch 114 may be implemented using, for example, p-channel or p-type metal-oxide-semiconductor (PMOS) devices that are forming with n-well or n-substrate technology, such as a p-type field effect transistor (PFET). The head switch 114 may be realized as a globally distributed head switch (GDHS) or as a block head switch (BHS).

The head switch 114 includes multiple power-multiplexer tiles 110-1 to 110-10. Specifically, ten power-multiplexer tiles 110-1, 110-2, 110-3, 110-4, 110-5, 110-6, 110-7, 110-8, 110-9, and 110-10 are shown distributed around the circuit load 108. However, the head switch 114 may include a different number of power-multiplexer tiles 110. Multiple power-multiplexer tiles 110-1 to 110-10 are disposed at least partially around the circuit load 108 in a particular layout, such as along one side or along two or more sides of the circuit load 108, to facilitate providing power evenly across the circuit load 108. However, other power-multiplexer tile layouts may alternatively be implemented. Although some of the multiple power-multiplexer tiles 110-1 to 110-10 are shown as being physically adjacent to at least one other power-multiplexer tile 110, two or more power-multiplexer tiles 110 may alternatively be disposed in a spaced-apart arrangement.

Although not explicitly illustrated in FIG. 1, the first power rail 102 and the second power rail 104 are both coupled to each power-multiplexer tile 110. Each power-multiplexer tile 110 is further coupled to the load power rail 106, and the load power rail 106 is coupled to the circuit load 108. For the integrated circuit 100, the first power rail 102 and the second power rail 104 are configured to supply power to the load power rail 106 and thus to the circuit load 108 via the head switch 114 using the multiple power-multiplexer tiles 110-1 to 110-10. In operation, each power-multiplexer tile 110 is configured to switch from using the first power rail 102 to using the second power rail 104, and vice versa, to supply power to the circuit load 108 via the load power rail 106. An arrangement of multiple power-multiplexer tiles, along with power-multiplexer control circuitry and power-multiplexer control signals, is shown in FIG. 2.

Figure 2:
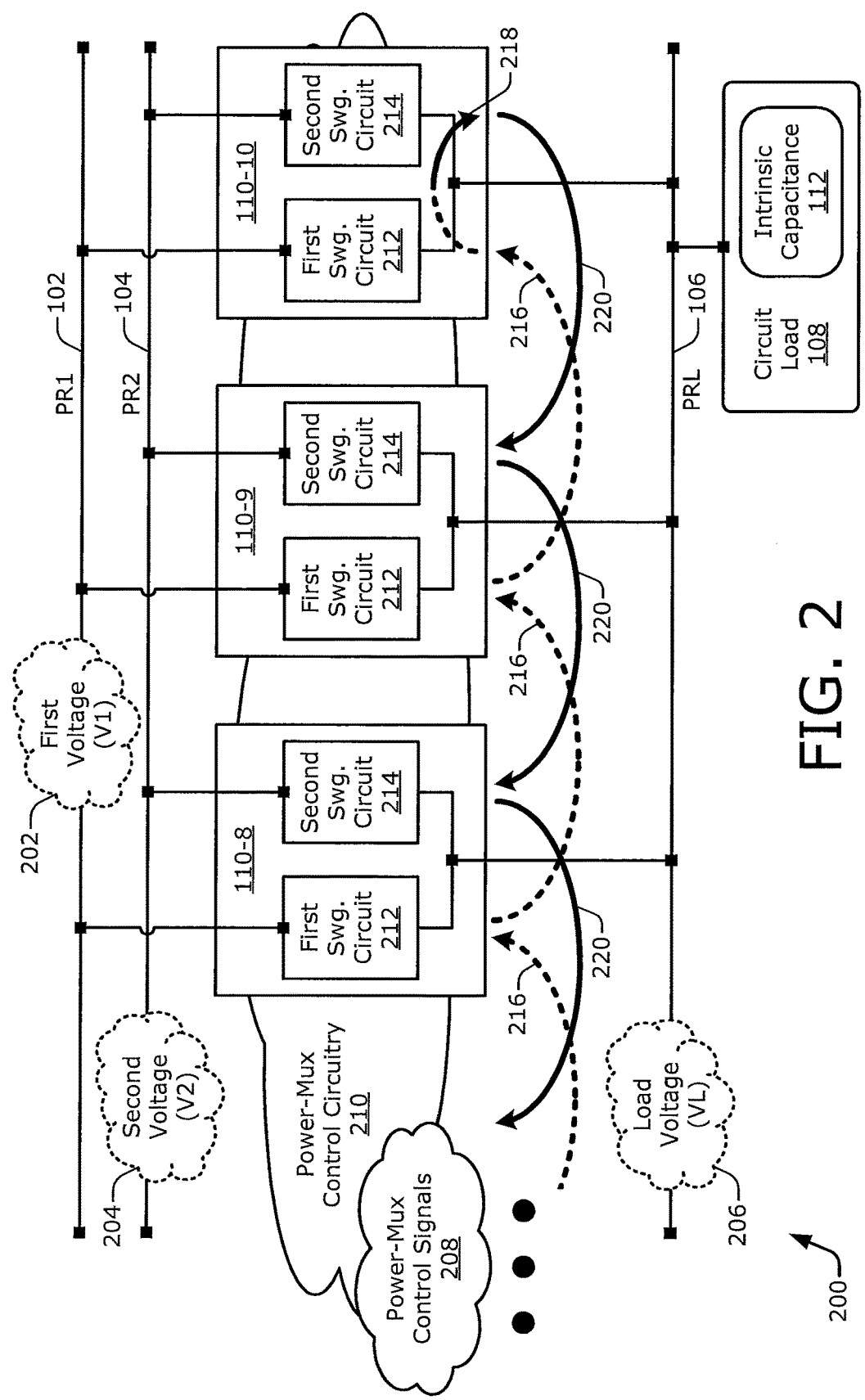
FIG. 2 illustrates an example chained arrangement of multiple power-multiplexer tiles, which include first and second switching circuits coupled to power rails, in conjunction with power-multiplexer control circuitry.

FIG. 2 illustrates an example chained arrangement 200 of multiple power-multiplexer tiles 110-1 to 110-10, which each include first and second switching circuits coupled to power rails, in conjunction with power-multiplexer control circuitry 210. Of the ten power-multiplexer tiles depicted in FIG. 1, three power-multiplexer tiles 110-8, 110-9, and 110-10 are explicitly shown for the chained arrangement 200. FIG. 2 also depicts the first power rail 102, the second power rail 104, the load power rail 106, the circuit load 108, and the intrinsic capacitance 112. FIG. 2 adds a first voltage 202 (V1), a second voltage 204 (V2), a load voltage 206 (VL), power-multiplexer control signals 208 (power-mux control signals), and power-multiplexer control circuitry 210 (power-mux control circuitry).

Each power-multiplexer tile 110 is depicted as including a first switching circuit 212 and a second switching circuit 214. The first power rail 102 is held at the first voltage 202, and the second power rail 104 is held at the second voltage 204. For example, a first power supply or power regulator (not shown) maintains the first voltage 202 on the first power rail 102, and a second power supply or power regulator (not shown) maintains the second voltage 204 on the second power rail 104. Alternatively, a joint power supply or power regulator, such as the power management integrated circuit 116 of FIG. 1, provides both voltages. The load power rail 106 can be held at the load voltage 206. For example, if one or more of the power-multiplexer tiles connect the first power rail 102 to the load power rail 106, the load power rail 106 can be held at the first voltage 202, and if one or more power-multiplexer tiles connect the second power rail 104 to the load power rail 106, the load power rail 106 can be held at the second voltage 204.

For example embodiments having a chained arrangement, the multiple power-multiplexer tiles 110-1 to 110-10 are coupled in series, at least from a control signal propagation perspective. The terminating power-multiplexer tile in the series, the power-multiplexer tile 110-10, is called the "last" power-multiplexer tile herein. Thus, the power-multiplexer tile 110-9 is called the "second-to-last" power-multiplexer tile, and the power-multiplexer tile 110-8 is called the "third-to-last" power-multiplexer tile. As shown, each of the power-multiplexer tiles 110-8, 110-9, and 110-10 is coupled to both the first power rail 102 and the second power rail 104. Each of the power-multiplexer tiles 110-8, 110-9, and 110-10 is also coupled to the load power rail 106. The load power rail 106 is coupled to the circuit load 108, which includes the intrinsic capacitance 112. Each first switching circuit 212 is coupled between the first power rail 102 and the load power rail 106, and each second switching circuit 214 is coupled between the second power rail 104 and the load power rail 106.

The power-multiplexer control signals 208 and the power-multiplexer control circuitry 210 are depicted as cloud shapes to represent that the signals and the circuitry, respectively, are distributed across the multiple power-multiplexer tiles 110-1 to 110-10. A portion of the power-multiplexer control circuitry 210 can be disposed internal to each power-multiplexer tile 110. Additionally or alternatively, a portion of the power-multiplexer circuitry 210 may be disposed external to the multiple power-multiplexer tiles 110-1 to 110-10, such as between or among the multiple power-multiplexer tiles 110-1 to 110-10 to propagate one or more signals of the power-multiplexer control signals 208. Examples aspects of the power-multiplexer control circuitry 210 and the power-multiplexer control signals 208 are described with reference to FIG. 3.

In an example operation, the power-multiplexer control circuitry 210 causes the multiple power-multiplexer tiles 110-1 to 110-10 to switch from an origin power rail to a destination power rail to perform a power-multiplexing operation. For instance, the power-multiplexer control circuitry 210 can cause the power-multiplexer tiles 110-1 to 110-10 to switch from coupling the load power rail 106 to the first power rail 102 to coupling the load power rail 106 to the second power rail 104, or vice versa. Generally, this power source switching can be performed at least partially sequentially by placing each second switching circuit 214 into a mode that permits current to flow in an order that starts from the "first" power-multiplexer tile 110-1 (of FIG. 1) and continues to the last power-multiplexer tile 110-10. If the switching circuits are implemented using one or more transistors, a transistor that is turned off corresponds to an open switch that blocks current flow, and a transistor that is turned on corresponds to a closed switch that enables current flow.

The power-rail switching for the power-multiplexing operation is performed sequentially from one power-multiplexer tile 110 to a consecutive power-multiplexer tile 110 along the chained arrangement 200. The thick dashed arrows 216 indicate a sequential progression of the power-rail switching from left-to-right. At the last power-multiplexer tile 110-10, the direction of progression for the power-multiplexing operation along the chained arrangement 200 reverses as indicated by the thick dashed-and-solid arrow 218. The thick solid arrows 220 indicate a sequential progression of the power-rail switching in a reverse direction from right-to-left. More generally, the power-multiplexer control circuitry 210 implements a power rail transition procedure, examples of which are described with reference to FIGS. 9-12.

In some implementations, each of the first switching circuit 212 and the second switching circuit 214 is capable of being in one of three current-flow modes: an on mode, an off mode, and a one-way mode. In the off current-flow mode, the switching circuit bi-directionally blocks current flow. In the on current-flow mode, the switching circuit enables bidirectional current flow. In the one-way current-flow mode, the switching circuit permits unidirectional current flow. If the circuit load 108 is being powered by the first power rail 102, the multiple first switching circuits 212 are in the on current-flow mode, and the multiple second switching circuits 214 are in the off current-flow mode. On the other hand, if the circuit load 108 is being powered by the second power rail 104, the multiple first switching circuits 212 are in the off current-flow mode, and the multiple second switching circuits 214 are in the on current-flow mode. The first switching circuits 212 and the second switching circuits 214 enable the power-multiplexer control circuitry 210 to establish different current-flow modes between a power supply rail and the load power rail 106.

In an example power-rail-switching scenario, assume that the circuit load 108 is being powered by the first power rail 102 and that the power-multiplexer control circuitry 210 is managing a power-multiplexing operation to switch power rails such that the circuit load 108 is being powered by the second power rail 104. Initially, the multiple first switching circuits 212 are in the on current-flow mode, and the multiple second switching circuits 214 are in the off current-flow mode. The power-multiplexer control circuitry 210 places the first switching circuits 212 or the second switching circuits 214 in the one-way current-flow mode to permit unidirectional current flow but prevent bidirectional current flow. For example, the switching circuits that are coupled to the power rail having the lower voltage are placed in the one-way current-flow mode to prevent cross-conduction between power rails. Here, assume that the first voltage 202 is lower than the second voltage 204. In this case, the multiple first switching circuits 212 are placed in the one-way current-flow mode to permit unidirectional current flow from the first power rail 102 to the load power rail 106 and prevent unidirectional current flow from the load power rail 106 to the first power rail 102.

After the multiple first switching circuits 212 are placed in the one-way current-flow mode to prevent cross-conduction between the first power rail 102 and the second power rail 104, the power-multiplexer control circuitry 210 places the multiple second switching circuits 214 in the on current-flow mode. During this overlap phase, power can be supplied to the load power rail 106 from the first power rail 102 or the second power rail 104. The activation of the on current-flow mode for the multiple second switching circuits 214 is performed sequentially along the chained arrangement 200 to gradually draw increasing amounts of current from the second power rail 104. After the multiple second switching circuits 214 are in the on current-flow mode, the power-multiplexer control circuitry 210 places the multiple first switching circuits 212 in the off current-flow mode.

By placing the multiple first switching circuits 212 in the one-way current-flow mode prior to activating the on current-flow mode in the multiple second switching circuits 214, cross-conduction between the power rails is prevented. In this example manner, no appreciable short-circuit current is permitted to flow between the first power rail 102 and the second power rail 104. In other words, no short-circuit current is permitted to flow from the first power rail 102 to the second power rail 104 if the first voltage 202 is greater than the second voltage 204, or from the second power rail 104 to the first power rail 102 if the second voltage 204 is greater than the first voltage 202. Additionally, by sequentially activating the on current-flow mode for the multiple second switching circuits 214, power is applied to the circuit load 108 incrementally such that a size of an undesirable voltage droop along the second power rail 104 is at least reduced.

Figure 3:
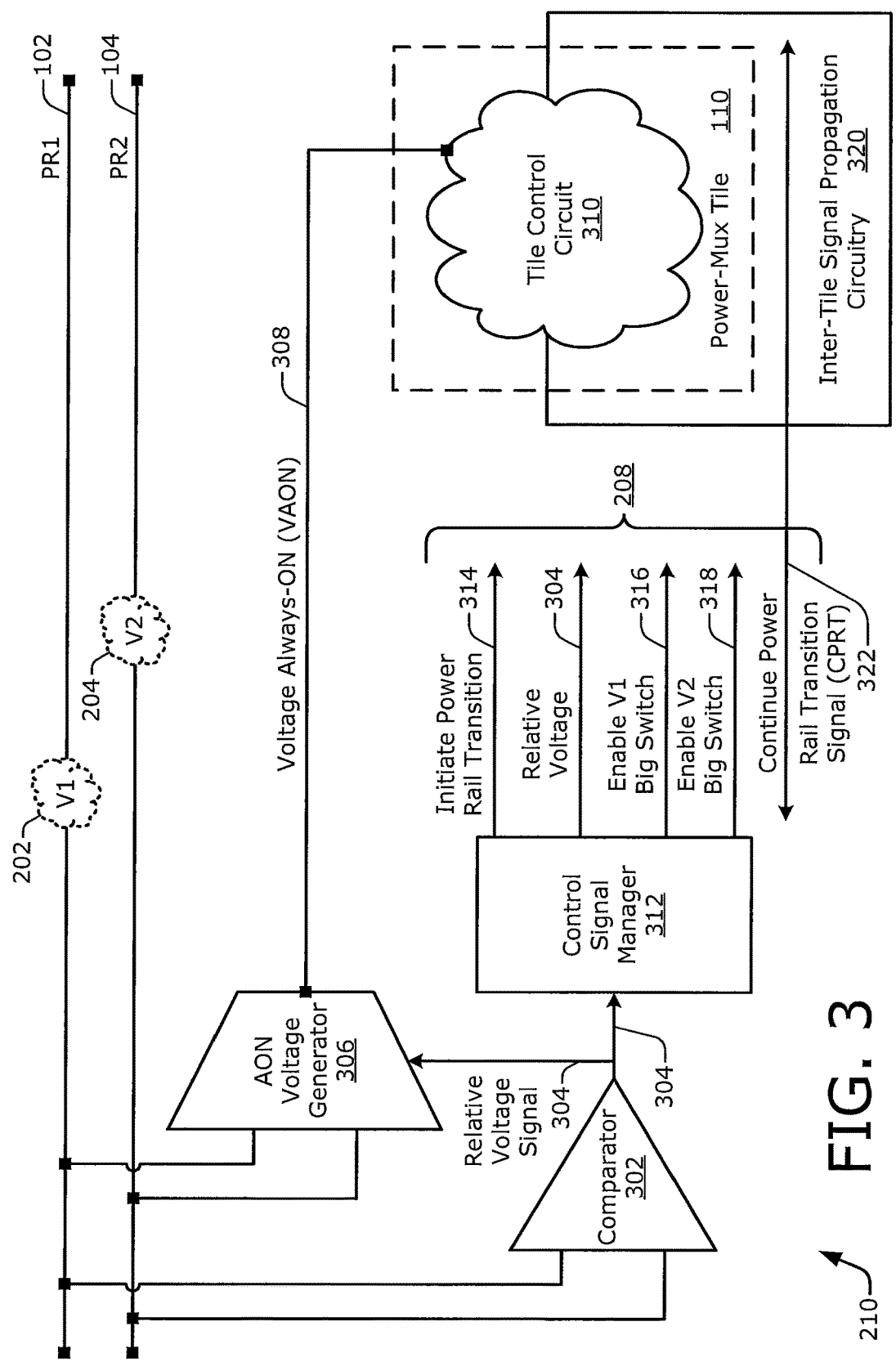
FIG. 3 illustrates an example of power-multiplexing control circuitry and associated power-multiplexing controls signals.

FIG. 3 illustrates an example of power-multiplexing control circuitry 210 and associated power-multiplexing controls signals 208. As shown, the power-multiplexer control circuitry 210 includes a comparator 302, an always-on voltage generator 306, a tile control circuit 310, inter-tile signal propagation circuitry 320, and a control signal manager 312. The power-multiplexer control signals 208 include an initiate power rail transition signal 314, a relative voltage signal 304, an enable first voltage big switch signal 316, an enable second voltage big switch signal 318, and a continue power rail transition signal 322 (CPRT).

In example embodiments, the comparator 302, the always-on voltage generator 306, and the control signal manager 312 can be realized with one instance apiece and shared with multiple power-multiplexer tiles. A tile control circuit 310, on the other hand, is included with each power-multiplexer tile 110. Thus, the chained arrangement 200 of multiple power-multiplexer tiles (of FIG. 2) includes multiple tile control circuits 310. The inter-tile signal propagation circuitry 320 is distributed within or between individual ones of the multiple power-multiplexer tiles.

The comparator 302 is coupled to the first power rail 102 and the second power rail 104 to receive the first voltage 202 and the second voltage 204, respectively. The comparator 302 performs a comparison including the first voltage 202 of the first power rail 102 and the second voltage 204 of the second power rail 104 to determine which voltage is relatively more or less than the other voltage. The comparator outputs the relative voltage signal 304 that is indicative of a voltage difference between the first voltage 202 of the first power rail 102 and the second voltage 204 of the second power rail 104, such as which voltage is less than or greater than the other. The relative voltage signal 304 is fed to the always-on voltage generator 306 and routed to the control signal manager 312.

The always-on voltage generator 306 uses the relative voltage signal 304 to determine whether the first voltage 202 of the first power rail 102 or the second voltage 204 of the second power rail 104 is greater. The always-on voltage generator 306 uses the greater of the two voltages to power circuitry of the always-on voltage generator 306. Alternatively, the always-on voltage generator 306 can be powered by a constant or separate always-on voltage obtained from another voltage source or power rail (not shown). As used herein, the term "always-on" is relative to the voltages provided by the first power rail 102 and the second power rail 104 which are subject to the voltage changes of a dynamic voltage scaling implementation. However, from a higher perspective of an integrated circuit, an "always-on" voltage may also be reduced or shut off as part of a power collapse event pertaining to a larger core or to a group of cores. Based on the relative voltage signal 304, the always-on voltage generator 306 forwards the higher of the two voltages as an always-on voltage 308 (VAON) to the multiple power-multiplexer tiles 110-1 to 110-10.

The power-multiplexer control circuitry 210 distributes the always-on voltage 308 to the chained arrangement 200 (of FIG. 2) of multiple power-multiplexer tiles. The always-on voltage 308 is used to power the tile control circuit 310 at each power-multiplexer tile 110. Operation of the tile control circuit 310 is described further with reference to FIG. 3 with regard to a first switching circuit 212 and a second switching circuit 214.

Between each power-multiplexer tile 110, the inter-tile signal propagation circuitry 320 propagates the continue power rail transition signal 322. The inter-tile signal propagation circuitry 320 can also propagate one or more other signals of the power-multiplexer control signals 208. For example, the control signal manager 312 can distribute the relative voltage signal 304 to the tile control circuit 310 of each power-multiplexer tile 110 via the inter-tile signal propagation circuitry 320.

The control signal manager 312 is also responsible for providing to the power-multiplexer tiles other signals to control a power-multiplexing operation. For instance, the initiate power rail transition signal 314 starts a power rail transition procedure at the first power-multiplexer tile 110-1 to switch which power supply rail is coupled to a circuit load via a load power rail. The initiate power rail transition signal 314 can also function as a power rail selection signal to indicate or identify a destination power rail for a power rail transition procedure, especially if more than two different power supply rails can be coupled to the load power rail 106. Alternatively, the control signal manager 312 can send a separate power rail selection signal (not shown).

The enable first voltage big switch signal 316 is asserted to enable activation of, or to turn on, a big switch of a first switching circuit 212 that is coupled to the first power rail 102 being held at the first voltage 202. The enable second voltage big switch signal 318 is asserted to enable activation of, or to turn on, a big switch of a second switching circuit 214 that is coupled to the second power rail 104 being held at the second voltage 204. Examples of big switches are described with reference to FIGS. 5-7. The control signal manager 312 asserts these signals at appropriate times during a power rail transition procedure as described with reference to FIGS. 9-12.

Figure 4:
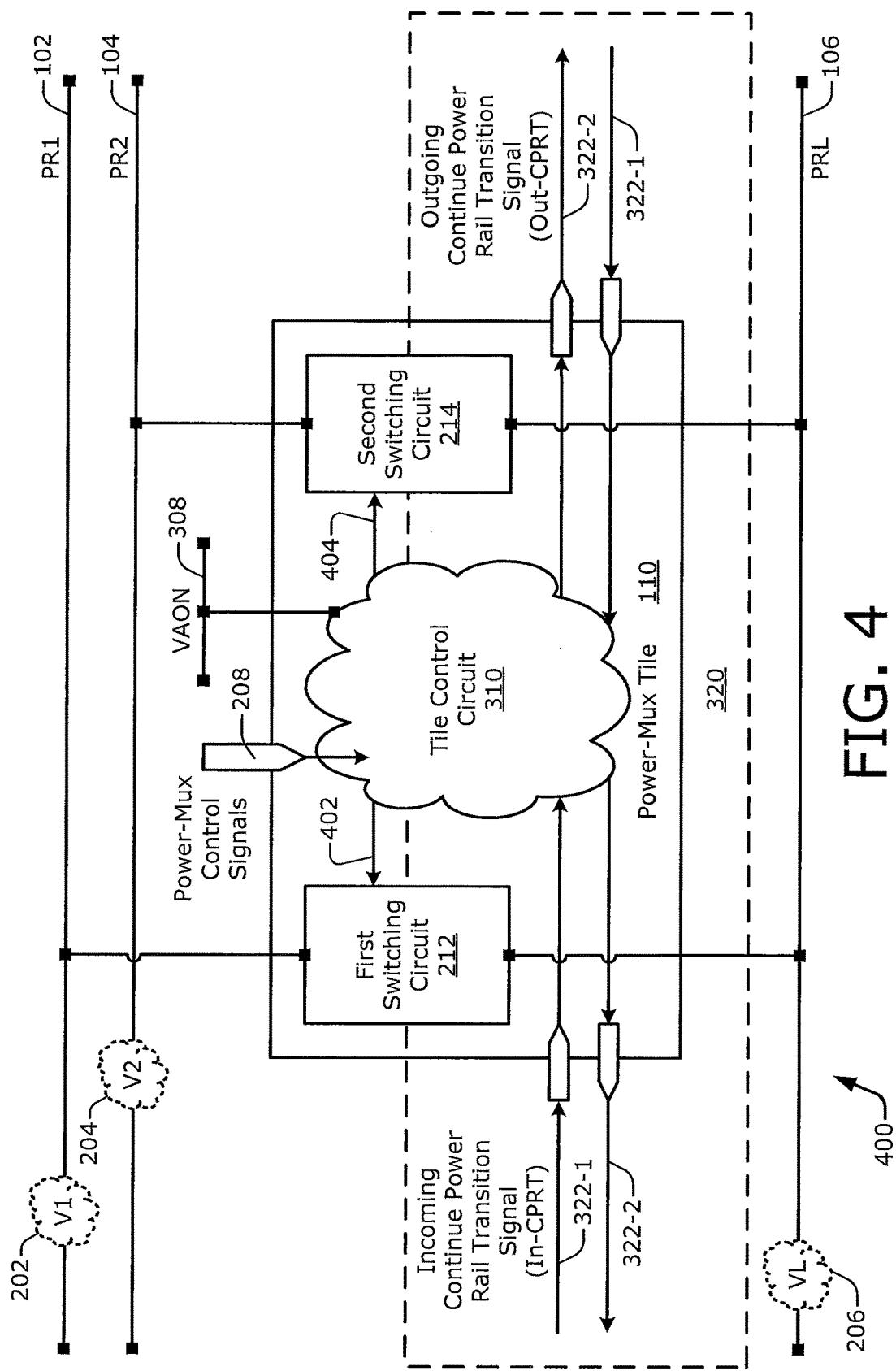
FIG. 4 illustrates an example power-multiplexing control interface and arrangement for a power-multiplexer tile.

FIG. 4 illustrates generally at 400 an example power-multiplexing control interface and arrangement for a power-multiplexer tile 110. The illustrated power-multiplexer tile 110 represents a power-multiplexer tile along a chained arrangement 200 of multiple power-multiplexer tiles. The power-multiplexer tile 110 includes a first switching circuit 212, a second switching circuit 214, and a tile control circuit 310. The first switching circuit 212 is coupled between the first power rail 102 and the load power rail 106. The second switching circuit 214 is coupled between the second power rail 104 and the load power rail 106.

The tile control circuit 310 is capable of controlling operation of the first switching circuit 212 and the second switching circuit 214 via a control signal 402 and a control signal 404, respectively. For example, the tile control circuit 310 can place the first switching circuit 212 and the second switching circuit 214 in a current-flow mode, such as on, off, or one-way. The tile control circuit 310 is realized as combinational circuitry or a state machine that places the first switching circuit 212 and the second switching circuit 214 in an appropriate current-flow mode responsive to the power-multiplexer control signals 208 so as to implement a power rail transition procedure (e.g., of FIGS. 9-12). The tile control circuit 310 can, for example, be implemented as self-timed circuitry, which operates independently of a periodic clock signal.

From centralized control circuitry of the power-multiplexer control circuitry 210, the tile control circuit 310 receives one or more of the power-multiplexer control signals 208 and the always-on voltage 308. The power-multiplexer control signals 208 include the relative voltage signal 304. Based on the relative voltage signal 304, the tile control circuit 310 knows which of the first switching circuit 212 and the second switching circuit 214 is to be activated in the one-way current-flow mode.

The inter-tile signal propagation circuitry 320 can include metal wires, buffers, and other circuitry to propagate control signals between consecutive power-multiplexer tiles along a chained arrangement of power-multiplexer tiles. Via the inter-tile signal propagation circuitry 320, the tile control circuit 310 also receives and subsequently forwards a continue power rail transition signal 322. More specifically, from left-to-right, the tile control circuit 310 receives an incoming continue power rail transition signal 322-1 (In-CPRT) from an immediately preceding power-multiplexer tile in the chain. Responsive to the incoming continue power rail transition signal 322-1, the tile control circuit 310 performs a current phase of a power rail transition procedure. After completing the current phase at a timing that is based on the self-timed circuitry of the tile control circuit 310, the tile control circuit 310 forwards an outgoing continue power rail transition signal 322-2 (Out-CPRT) to an immediately succeeding power-multiplexer tile in the chain. If the sequential performance of a phase of the power-multiplexing operation is proceeding from right-to-left, the incoming continue power rail transition signal 322-1 arrives from the right, and the outgoing continue power rail transition signal 322-2 is forwarded to the left.

Figure 5:
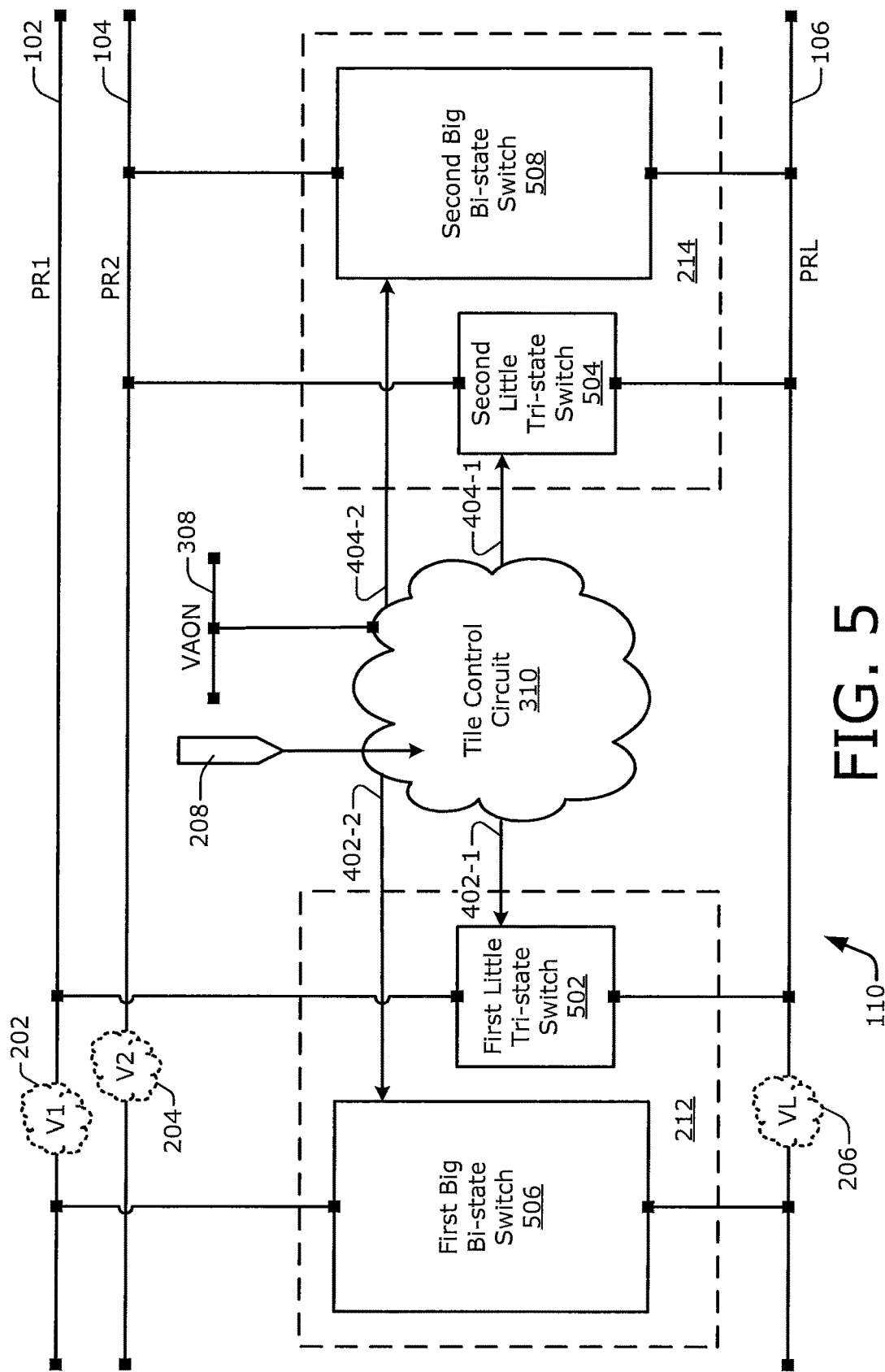
FIG. 5 illustrates a first example of a power-multiplexer tile with the first and second switching circuits realized with multiple switches, including big bi-state switches and little tri-state switches.

FIG. 5 illustrates a first example of a power-multiplexer tile 110 with the first switching circuit 212 and the second switching circuit 214 realized with multiple switches, including big bi-state switches and little tri-state switches. The power-multiplexer tile 110 is also shown to include the tile control circuit 310. The tile control circuit 310 receives the power-multiplexer control signals 208 and is powered by the always-on voltage 308. The always-on voltage 308 may be provided by the always-on voltage generator 306 of FIG. 3 or may be received from a separate always-on power source. The first switching circuit 212 is coupled between the first power rail 102 and the load power rail 106, and the second switching circuit 214 is coupled between the second power rail 104 and the load power rail 106.

In one or more example embodiments, the first switching circuit 212 includes a first tri-state switch and a first bi-state switch, and the second switching circuit 214 includes a second tri-state switch and a second bi-state switch. More specifically, the first switching circuit 212 includes a first little tri-state switch 502 and a first big bi-state switch 506. The first little tri-state switch 502 and the first big bi-state switch 506 are coupled between the first power rail 102 and the load power rail 106 in parallel with each other. The second switching circuit 214 includes a second little tri-state switch 504 and a second big bi-state switch 508. The second little tri-state switch 504 and the second big bi-state switch 508 are coupled in parallel to one another between the second power rail 104 and the load power rail 106.

The two big switches are physically larger than the two little switches. The big switches are capable of conducting a larger current than the little switches. By way of example only, the big switches may be 4 to 20 times larger in terms of physical size or current-conducting capacity. The different sizes between the little switches and the big switches can be employed to provide different amounts of current flow, such as a low current flow to a high current flow, to gradually introduce current to a circuit load being switched to a different power rail. This technique is analogous to a few versus rest transistor implementation, aspects of which are described further with reference to FIG. 7.

The first switching circuit 212 and the second switching circuit 214 of the power-multiplexer tile 110 participate in a power rail transition procedure by operating in accordance with the three current-flow modes described above, which are the on mode, the off mode, and the one-way mode. The switches illustrated in FIG. 5 support these three current-flow modes by entering one of three current-flow states: an off state, an on state, and a one-way state. In the off current-flow state, a switch bi-directionally blocks current flow between two power rails. In the on current-flow state, a switch enables bidirectional current flow between two power rails. In the one-way current-flow state, a switch permits unidirectional current flow from one power rail to another power rail, but not vice versa.

The first big bi-state switch 506 and the second big bi-state switch 508 are each capable of entering two current-flow states: the on state and the off state. The first little tri-state switch 502 and the second little tri-state switch 504 are each capable of entering three current-flow states: the on state, the off state, and the one-way state. In some implementations, the first little tri-state switch 502 and the second little tri-state switch 504 are each realized with at least one diode-connected transistor that is configurable to be selectively operated as a diode that permits unidirectional current flow to establish a one-way current-flow state.

The tile control circuit 310 determines in which state the various switches are operating. The tile control circuit 310 controls the first little tri-state switch 502 and the first big bi-state switch 506 via the control signal 402-1 and the control signal 402-2, respectively. The tile control circuit 310 controls the second little tri-state switch 504 and the second big bi-state switch 508 via the control signal 404-1 and the control signal 404-2, respectively. The tile control circuit 310 controls a state of the first little tri-state switch 502 and the second little tri-state switch 504 based on the relative voltage signal 304 (of FIG. 3). For example, during a power rail transition procedure, the tile control circuit 310 activates the one-way state of the little tri-state switch that is coupled to the power rail having the lower voltage.

An example power rail transition procedure is described in terms of switching a circuit load coupled to the load power rail 106 from the first power rail 102 to the second power rail 104 when a voltage level of the second voltage 204 is less than a voltage level of the first voltage 202. In an initial phase, the first little tri-state switch 502 and the first big bi-state switch 506 are both in the on state, and the second little tri-state switch 504 and the second big bi-state switch 508 are both in the off state. In a first phase, the tile control circuit 310 converts the first big bi-state switch 506 of the first switching circuit 212 to the off state and the second little tri-state switch 504 of the second switching circuit 214 to the one-way state.

In this example, this first phase is an overlapping phase in which power can be provided to the load power rail 106 from both the first power rail 102 via the first little tri-state switch 502 and the second power rail 104 via the second little tri-state switch 504. Cross-conduction between the first power rail 102 and the second power rail 104 is prevented by activating the one-way state of the second little tri-state switch 504, which is coupled to the second power rail 104 that is being held at the lower of the two voltages. In other words, a current direction is controlled by the tile control circuit 310 because the one-way state of the second little tri-state switch 504 permits current to flow from the second power rail 104 to the load power rail 106 but prevents current flow from the load power rail 106 to the second power rail 104.

In a second phase, the tile control circuit 310 converts the first little tri-state switch 502 from the on state to the off state. At this point, the load power rail 106 can receive current from the second power rail 104 via the second little tri-state switch 504 that is in the one-way state. In a third phase, the tile control circuit 310 converts the second little tri-state switch 504 from the one-way state to the on state. To increase the current flow available to the circuit load, the tile control circuit 310 converts the second big bi-state switch 508 from the off state to the on state in a fourth phase of the power rail transition procedure. Additional aspects of example power rail transition procedures are also described with reference to FIGS. 9-12.

Figure 6:
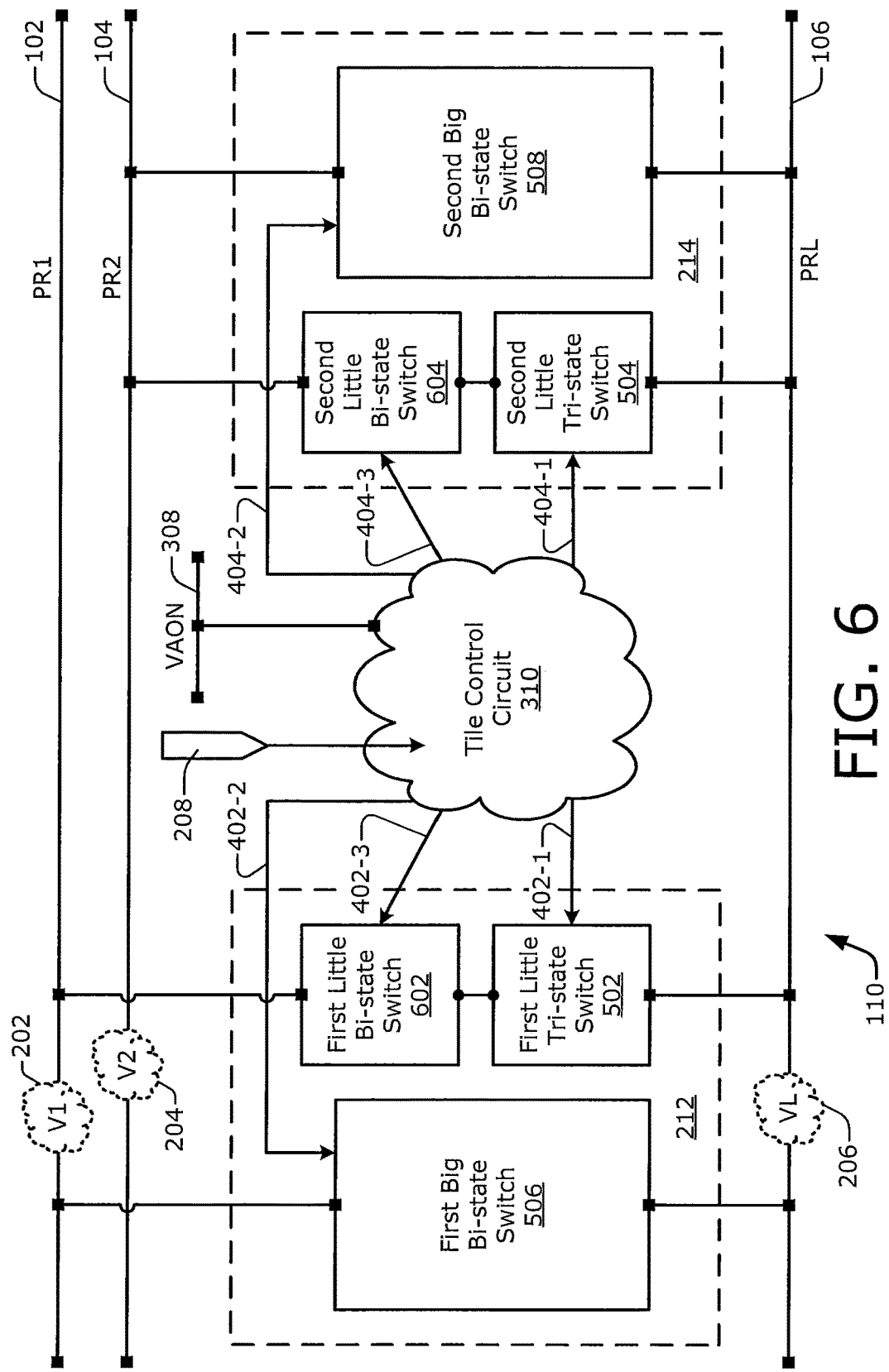
FIG. 6 illustrates a second example of a power-multiplexer tile with the first and second switching circuits realized with multiple switches.

FIG. 6 illustrates a second example of a power-multiplexer tile 110 with the first switching circuit 212 and the second switching circuit 214 realized with multiple switches. The power-multiplexer tile 110 of FIG. 6 is similar to the power-multiplexer tile 110 of FIG. 5. However, a first little bi-state switch 602 is incorporated into the first switching circuit 212, and a second little bi-state switch 604 is incorporated into the second switching circuit 214. The first little bi-state switch 602 is coupled in series with the first little tri-state switch 502 between the first power rail 102 and the load power rail 106, with the first little bi-state switch 602 coupled to the first power rail 102. The second little bi-state switch 604 is coupled in series with the second little tri-state switch 504 between the second power rail 104 and the load power rail 106, with the second little bi-state switch 604 coupled to the second power rail 104.

In example implementations, the first little bi-state switch 602 and the second little bi-state switch 604 can be placed in the on current-flow state or the off current-flow state. The tile control circuit 310 controls a state of the first little bi-state switch 602 with a control signal 402-3 and controls a state of the second little bi-state switch 604 with a control signal 404-3. The tile control circuit 310 places the first little bi-state switch 602 in the on current-flow state if the first little tri-state switch 502 is in the on current-flow state or in the one-way current-flow state. On the other hand, if the first little tri-state switch 502 is in the off current-flow state, the tile control circuit 310 places the first little bi-state switch 602 in the off current-flow state. Similarly, the tile control circuit 310 places the second little bi-state switch 604 in the on current-flow state if the second little tri-state switch 504 is in the on current-flow state or in the one-way current-flow state. However, if the second little tri-state switch 504 is in the off current-flow state, the tile control circuit 310 places the second little bi-state switch 604 in the off current-flow state.

The inclusion of an additional little bi-state switch in series with each of the little tri-state switches can reduce leakage current. For example, the inclusion of the first little bi-state switch 602 in series with the first little tri-state switch 502 reduces leakage current from the first little tri-state switch 502 when the first little tri-state switch 502 enters the off current-flow state. This leakage current reduction capability is more apparent from the description of FIG. 7, which depicts the various switches as being realized with one or more transistors.

Figure 7:
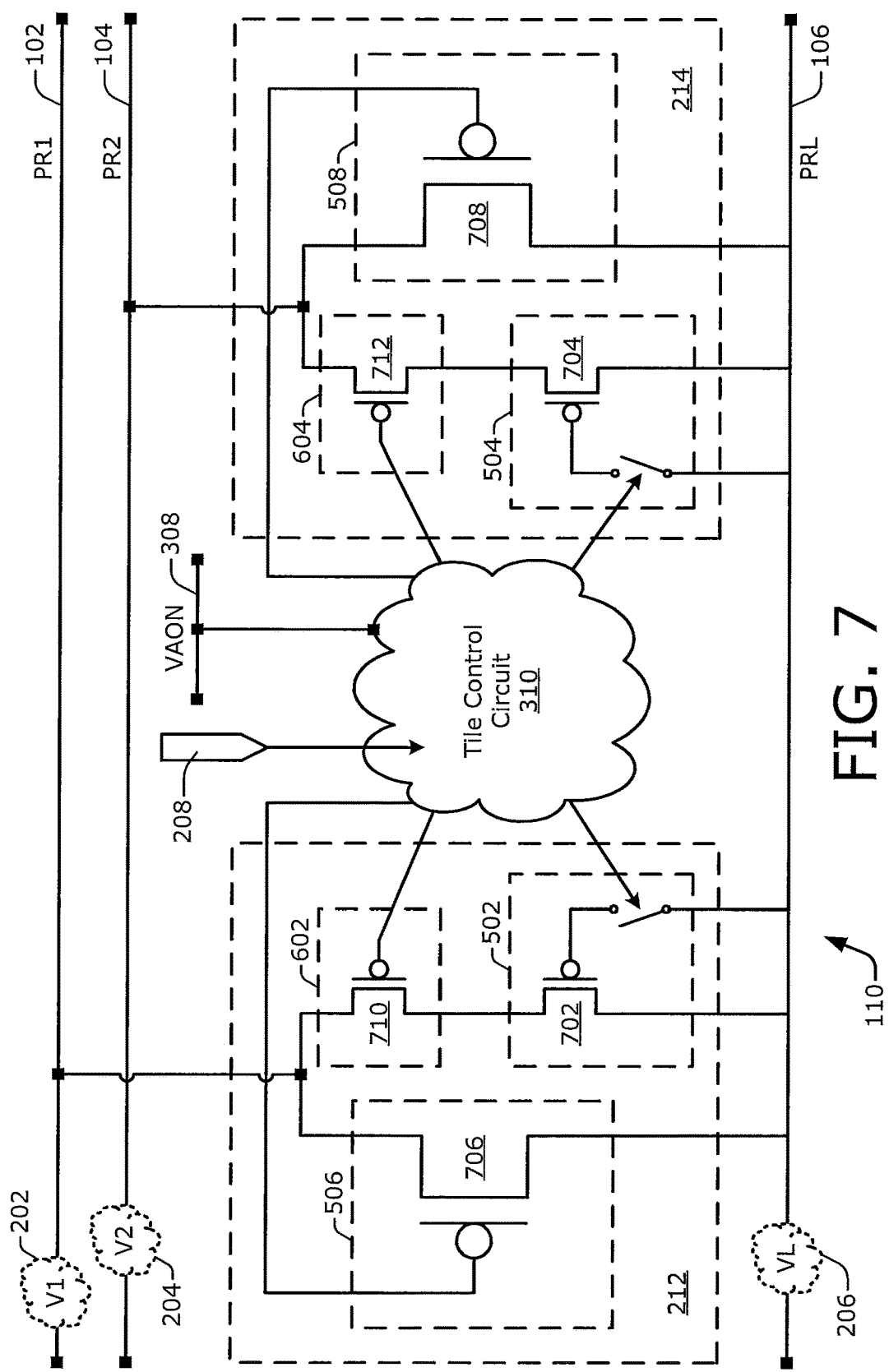
FIG. 7 illustrates the second example of a power-multiplexer tile with the first and second switching circuits realized with multiple switches at a transistor level.

FIG. 7 illustrates the second example of a power-multiplexer tile 110 (of FIG. 6) with the first switching circuit 212 and the second switching circuit 214 depicted as having the multiple switches realized by at least one transistor. For this second example implementation, each switch of the power-multiplexer tile 110 is realized using at least one PFET. The first little tri-state switch 502 is implemented as a first little transistor, such as a PFET 702; the first big bi-state switch 506 is implemented as a first big transistor, such as a PFET 706; and the first little bi-state switch 602 is implemented as another little transistor, such as a PFET 710. The second little tri-state switch 504 is implemented as a second little transistor, such as a PFET 704; the second big bi-state switch 508 is implemented as a second big transistor, such as a PFET 708; and the second little bi-state switch 604 is implemented as yet another little transistor, such as a PFET 712.

In one or more embodiments, the PFET 706 and the PFET 708 are physically larger than the PFET 702, the PFET 710, the PFET 704, and the PFET 712. Consequently, the PFET 706 and the PFET 708 can conduct more current than the other four PFETs. The PFET 706 and the PFET 708 are therefore depicted as being larger in FIG. 7. In FIG. 7, reference numbers for the control signals from the tile control circuit 310 to the different switches are omitted for the sake of visual clarity. However, the control signals are routed as shown to the gate terminals of each of the PFET 706, the PFET 710, the PFET 708, and the PFET 712. A low voltage at the gate terminal of a PFET turns the transistor on, and a high voltage at the gate terminal of a PFET turns the transistor off.

The power-multiplexer tile 110 is operated analogously to a power supply technique in which a "few" transistors are turned on prior to the "rest" of the transistors. In a few versus rest transistor scheme, the few transistors are turned on first to permit current to flow into a circuit load at a relatively lower pace to reduce the chance that an appreciable voltage droop occurs on the power supply rail. After the current flows have stabilized or after some period of time, the rest of the transistors are turned on to increase the overall current capacity of the power being supplied. With the power-multiplexer tile 110, the little switches correspond to the "few" transistors, and the big switches corresponds to the "rest" of the transistors. Accordingly, the little switches are turned on before the big switches in the example power rail transition procedures described below with reference to FIGS. 9-12.

The transistors used to realize the switches of the power-multiplexer tile 110 are PFETs. If the chained arrangement 200 (of FIG. 2) of power-multiplexer tiles 110-1 to 110-10 is implemented as a head switch 114 that is coupled between power supply rails and the circuit load 108 to create a virtual power rail, the switches are realized with PFETs. However, the chained arrangement 200 of power-multiplexer tiles 110-1 to 110-10 can alternatively be implemented as a foot switch (not shown) that is coupled between the circuit load 108 and a ground power rail to create a virtual ground rail. A foot switch may be implemented using, for example, n-channel or n-type metal-oxide-semiconductor (NMOS) devices that are formed with p-well or p-substrate technology, such as an n-type field effect transistor (NFET). Thus, the switches of the power-multiplexer tile 110 can be realized with one or more NFETs in a foot switch implementation. Furthermore, the switches may be realized with other transistor types, such as a bipolar junction transistor (BJT).

The first little tri-state switch 502 is implemented as the PFET 702 that is connected in a diode configuration, or as a diode-connected transistor. The second little tri-state switch 504 is implemented as the PFET 704 that is also connected in a diode configuration, or as a diode-connected transistor. With a metal-oxide-semiconductor field-effect transistor (MOSFET), for example, a transistor can be connected in diode configuration by coupling the gate to the drain. At a high level, the tile control circuit 310 can place the PFET 702 or the PFET 704 in a diode-connected configuration to activate the one-way current-flow state by selectively closing a switch to couple a respective gate terminal of a corresponding PFET to the load power rail 106. Additional aspects of examples for a diode-connected transistor implementation of the first little tri-state switch 502 and the second little tri-state switch 504 are described with reference to FIG. 8. Example timings for activating a diode-configuration of the two transistors to realize the one-way current-flow state are described with reference to FIGS. 9-12.

Figure 8:
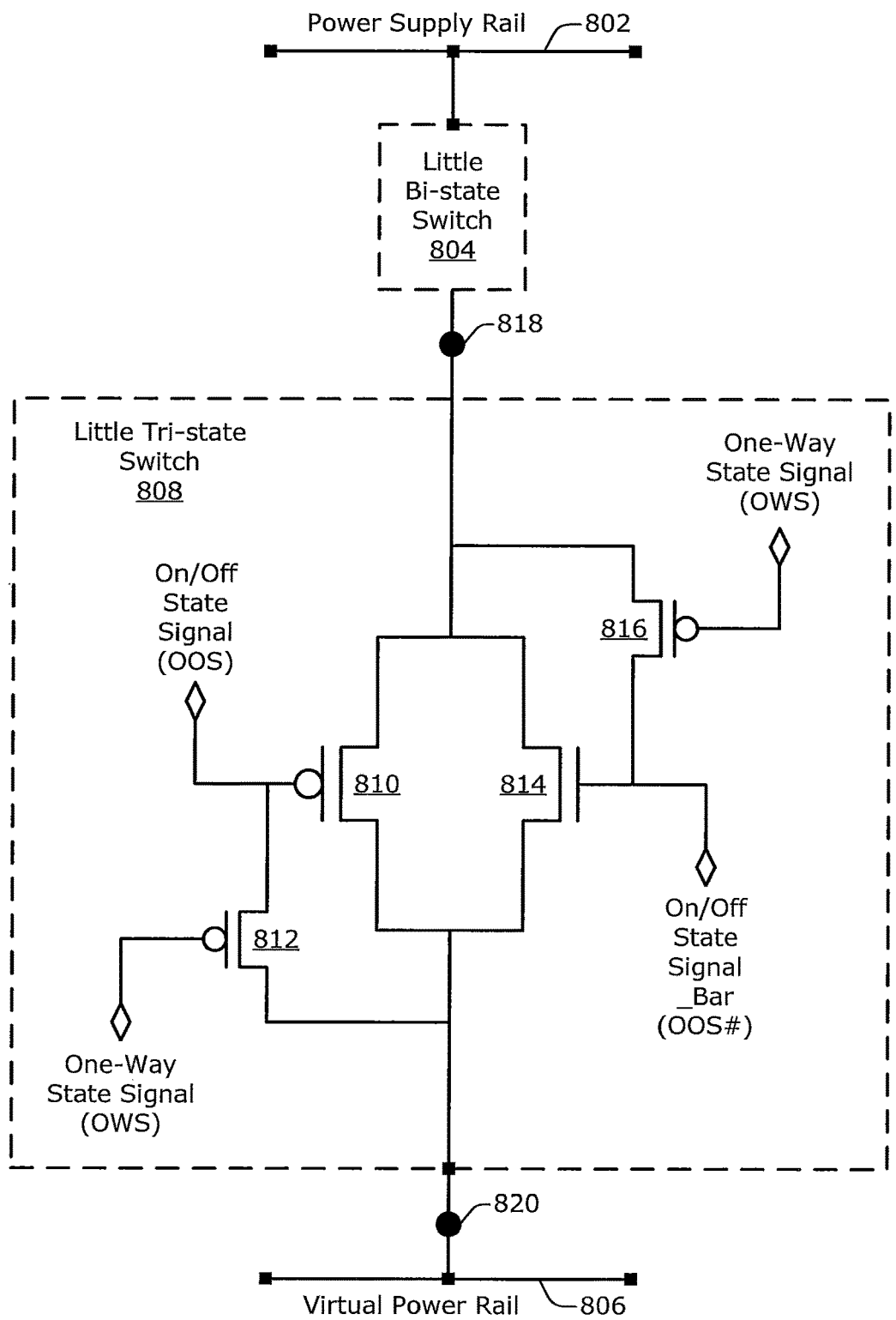
FIG. 8 illustrates an example of a little tri-state switch at a transistor level.

FIG. 8 illustrates generally at 800 an example of a little tri-state switch 808 at a transistor level. FIG. 8 depicts a power supply rail 802, a little bi-state switch 804, a node 818, the little tri-state switch 808, a node 820, and a virtual power rail 806. The little bi-state switch 804 is coupled between the power supply rail 802 and the node 818. The little tri-state switch 808 is coupled between the node 818 and the node 820. The node 820 is co-located with the virtual power rail 806. With reference to earlier figures, such as FIG. 6, the power supply rail 802, the little bi-state switch 804, the little tri-state switch 808, and the virtual power rail 806 can respectively correspond to the first power rail 102, the first little bi-state switch 602, the first little tri-state switch 502, and the load power rail 106 for the first switching circuit 212. Alternatively, the power supply rail 802, the little bi-state switch 804, the little tri-state switch 808, and the virtual power rail 806 can respectively correspond to the second power rail 104, the second little bi-state switch 604, the second little tri-state switch 504, and the load power rail 106 for the second switching circuit 214.

As illustrated, the little tri-state switch 808 includes four transistors: a PFET 810, a PFET 812, an NFET 814, and a PFET 816. The PFET 810 and the NFET 814 are coupled in parallel between the node 818 and the node 820. The PFET 810 and the NFET 814 are capable of being selectively or switchably connected into a diode configuration. To implement the selectivity, the PFET 812 is coupled between a gate terminal of the PFET 810 and the node 820, which corresponds to the drain of the PFET 810. Similarly, the PFET 816 is coupled between a gate terminal of the NFET 814 and the node 818, which corresponds to the drain of the NFET 814.

With reference also to FIG. 6, the various signals indicated in the little tri-state switch 808 correspond to the control signal 402-1 for the first little tri-state switch 502 of the first switching circuit 212 and to the control signal 404-1 for the second little tri-state switch 504 of the second switching circuit 214. An on/off state signal (OOS) is coupled to the gate terminal of the PFET 810. An on/off state signal_bar (OOS#) is the complement of the on/off state signal (OOS) and is coupled to the gate terminal of the NFET 814. A one-way state signal (OWS) is coupled to a gate terminal of the PFET 812 and to a gate terminal of the PFET 816.

Each of the transistors can be turned on or off based on a voltage applied to the gate terminals thereof. For the PFETs, a low voltage turns the transistor on, and a high voltage turns the transistor off. In contrast for the NFET, a high voltage turns the transistor on, and a low voltage turns the transistor off. To activate the one-way current-flow state of the little tri-state switch 808, the tile control circuit 310 switches the PFET 810 and the NFET 814 into the diode-connected mode by turning on the PFET 812 and the PFET 816. To do so, the tile control circuit 310 drives the one-way state signal (OWS) low at the gate terminals of the PFET 812 and the PFET 816 to turn on the PFET 812 and the PFET 816.

To deactivate the one-way current-flow state of the little tri-state switch 808, the tile control circuit 310 drives the one-way state signal (OWS) high at the gate terminals of the PFET 812 and the PFET 816 to turn off the PFET 812 and the PFET 816. If the PFET 812 and the PFET 816 are turned off, the little tri-state switch 808 can enter the on current-flow state or the off current-flow state. To place the little tri-state switch 808 in the on current-flow state, the tile control circuit 310 drives the on/off state signal (OOS) low and thus the on/off state signal_bar (OOS#) high to turn on the PFET 810 and the NFET 814, respectively. To place the little tri-state switch 808 in the off current-flow state, the tile control circuit 310 drives the on/off state signal (OOS) high and thus the on/off state signal_bar (OOS#) low to turn off the PFET 810 and the NFET 814, respectively. Thus, the illustrated little tri-state switch 808 is an example implementation for a switch having three states: an on current-flow state, an off current-flow state, and a one-way current-flow state.

Figure 9:
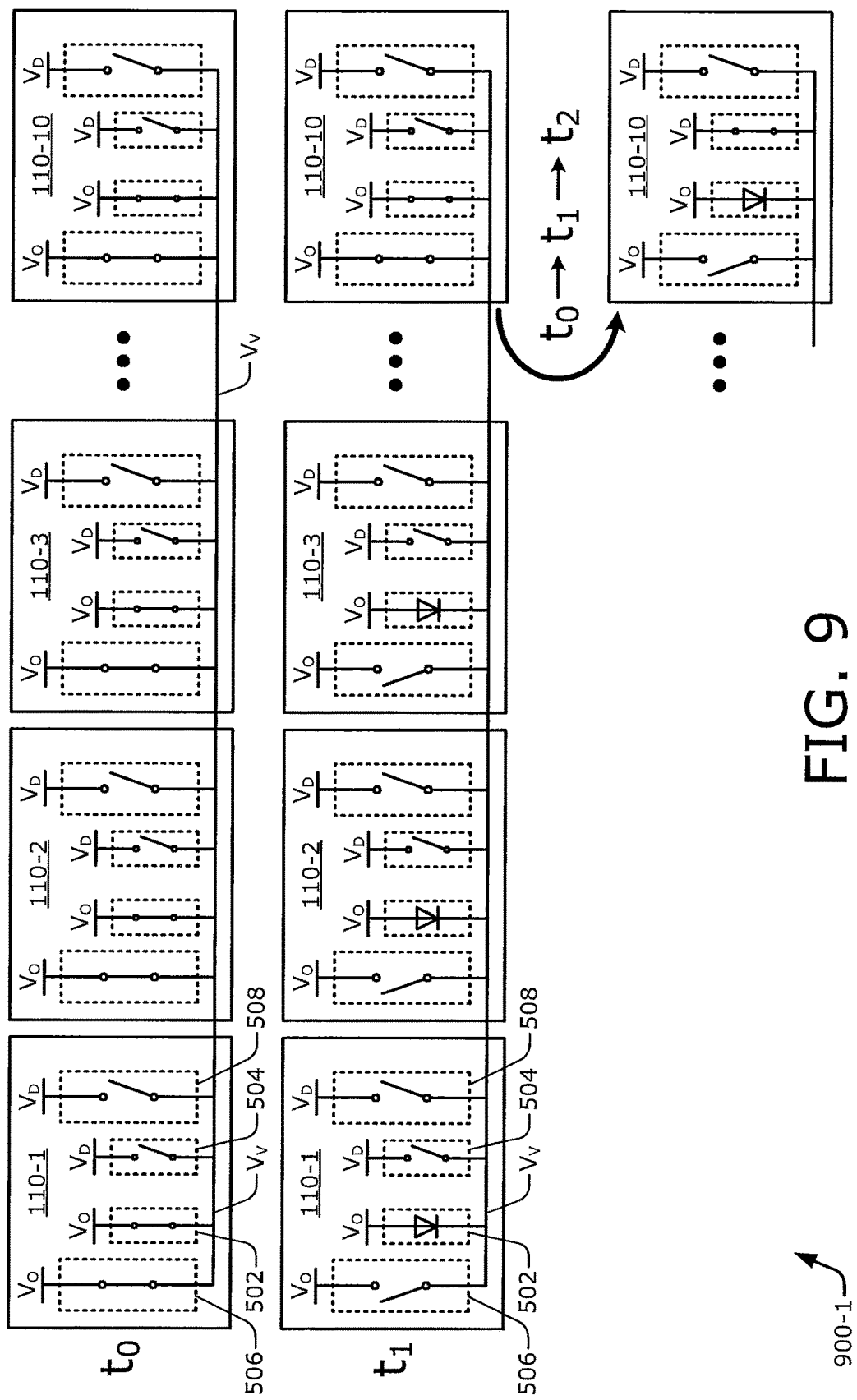
FIG. 9 illustrates a first portion of an example power rail transition procedure for an origin power source having a lower voltage level than a destination power source.
Figure 10:
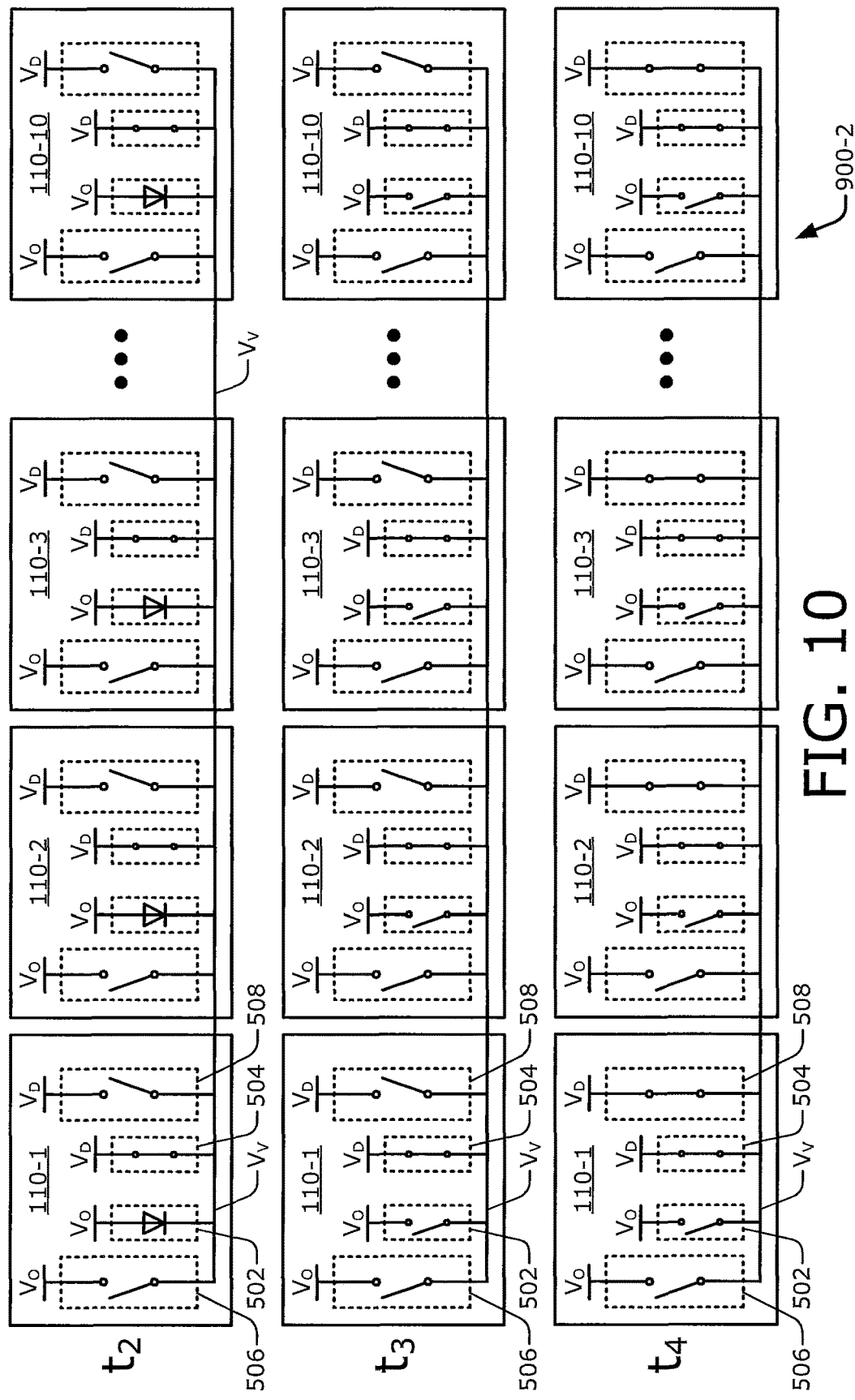
FIG. 10 illustrates a second portion of the example power rail transition procedure for an origin power source having a lower voltage level than a destination power source.
Figure 11:
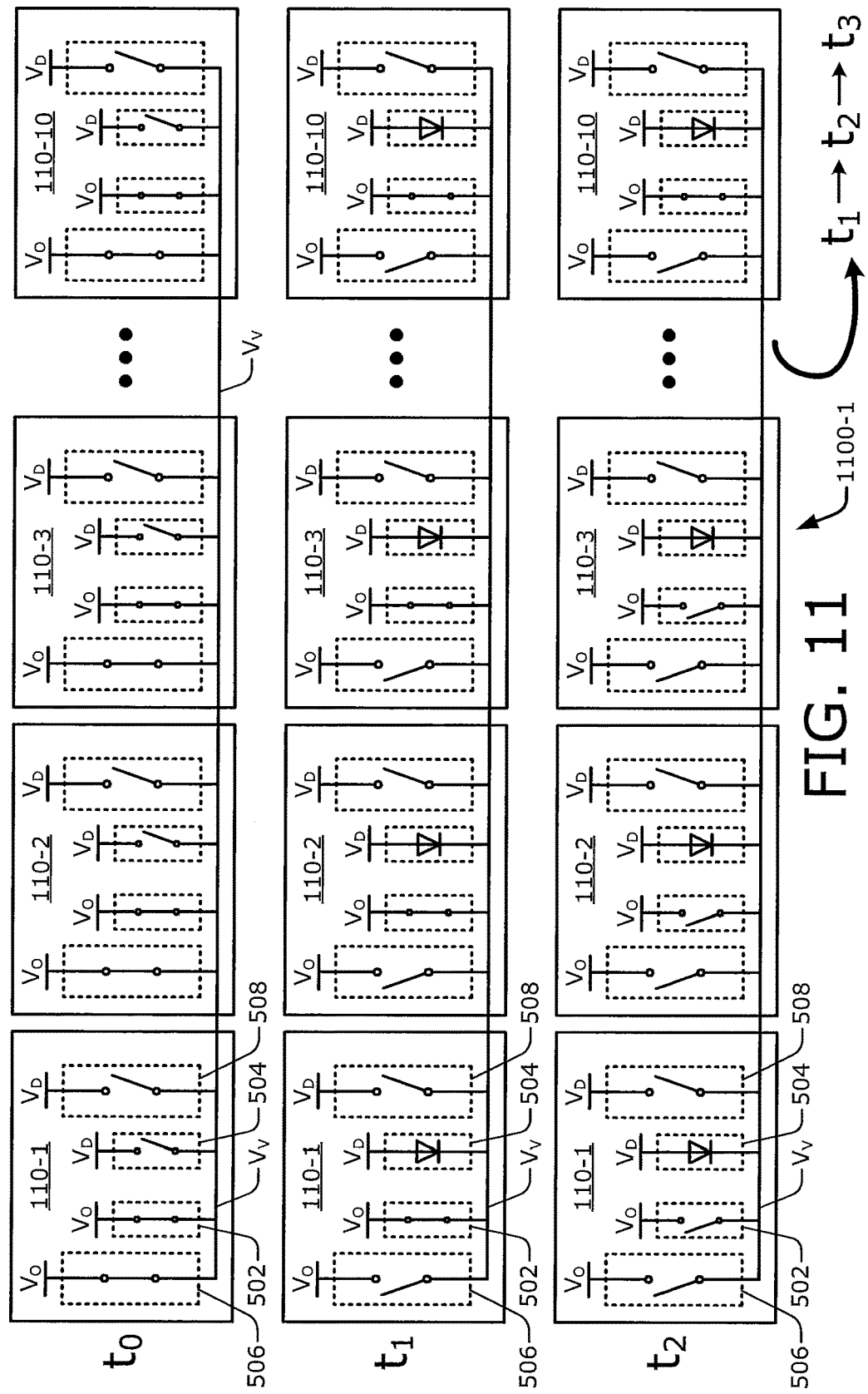
FIG. 11 illustrates a first portion of an example power rail transition procedure for an origin power source having a higher voltage level than a destination power source.
Figure 12:
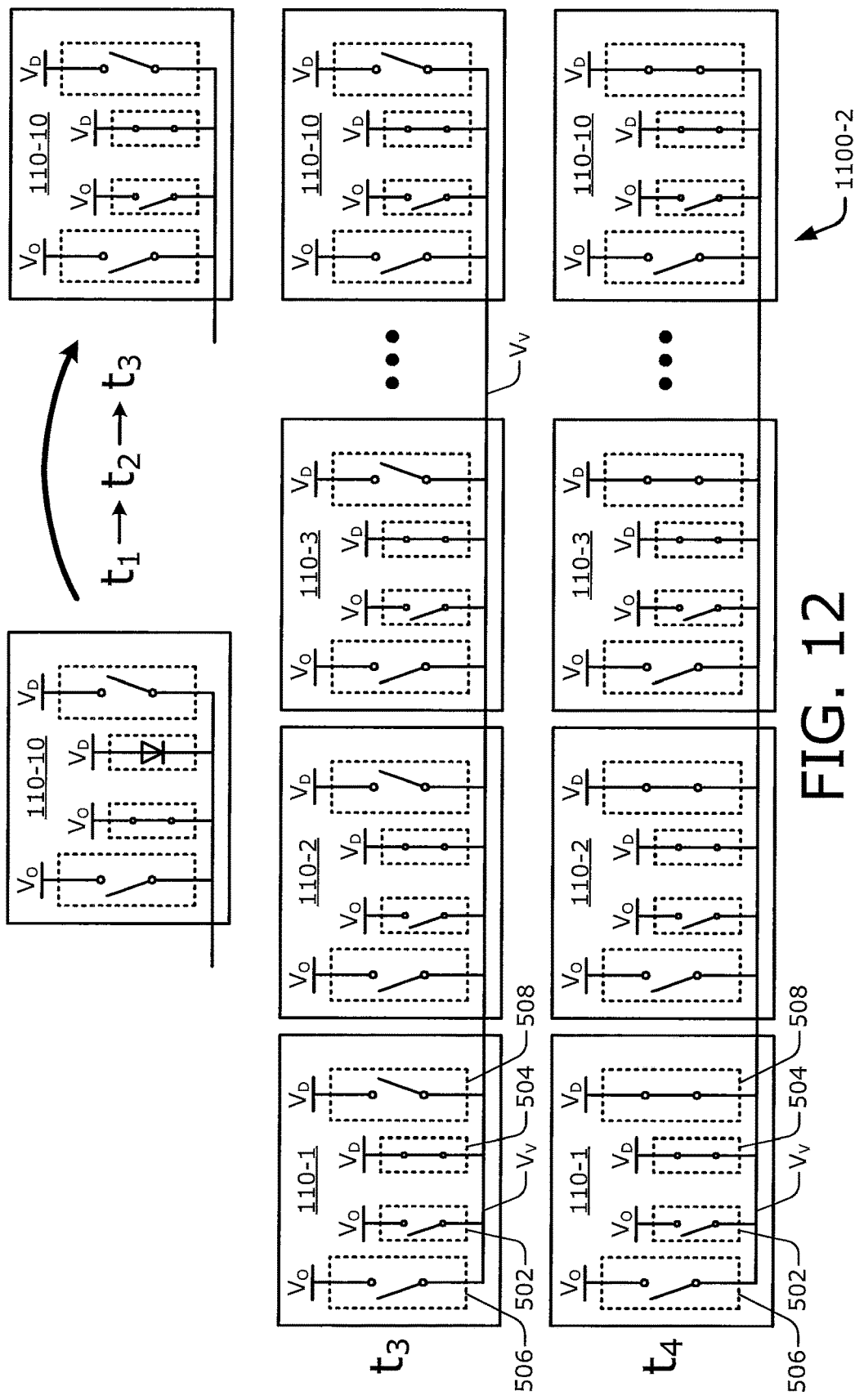
FIG. 12 illustrates a second portion of the example power rail transition procedure for an origin power source having a higher voltage level than a destination power source.

FIGS. 9-12 illustrate two example power rail transition procedures between an origin power rail and a destination power rail. FIGS. 9 and 10 illustrate an example power rail transition procedure 900 for an origin power source having a lower voltage level than a destination power source. FIGS. 11 and 12 illustrate an example power rail transition procedure 1100 for an origin power source having a higher voltage level than a destination power source. Each power rail transition procedure includes multiple phases with each phase represented by a horizontal row of multiple power-multiplexer tiles 110-1 to 110-10 that are coupled to together in a chained arrangement. As shown, each power rail transition procedure has five phases: an initial phase, a first phase, a second phase, a third phase, and a fourth phase. These five phases are respectively indicated by $t_0$, $t_1$, $t_2$, $t_3$, and $t_4$.

Power-multiplexer control circuitry 210 (of FIG. 2) converts multiple first switching circuits 212 or multiple second switching circuits 214 from one current-flow mode to another current-flow mode by converting one or more switches from one current-flow state to another current-flow state. With reference to the power-multiplexer tile 110-1 in the initial phase ($t_0$) that is depicted in FIG. 9, each power-multiplexer tile 110 includes a first big bi-state switch 506, a first little tri-state switch 502, a second little tri-state switch 504, and a second big bi-state switch 508. For the sake of visual clarity, these reference numbers are included just at the power-multiplexer tile 110-1 in each phase. The first big bi-state switch 506 and the first little tri-state switch 502 are depicted as being coupled to an origin power rail having an origin voltage ($V_O$). The second little tri-state switch 504 and the second big bi-state switch 508 are depicted as being coupled to a destination power rail having a destination voltage ($V_D$).

Each switch is shown as being in one of three current-flow states: an on state, an off state, and a one-way state. The on current-flow state is represented by a closed switch. The off current-flow state is represented by an open switch. The one-way current-flow state is represented by a diode that points downward away from the origin power rail or away from the destination power rail and therefore towards the virtual power rail providing a virtual voltage ($V_V$) for a circuit load. Thus, the one-way current-flow state permits current to flow from the origin power rail or from the destination power rail to the virtual power rail and prevents current flow from the virtual power rail to the origin power rail or to the destination power rail.

FIGS. 9 and 10 illustrate a first portion 900-1 and a second portion 900-2, respectively, of the example power rail transition procedure 900 for an origin power source having a lower voltage level than a destination power source. In the initial phase ($t_0$) in which the origin power rail is coupled to the virtual power rail, the first big bi-state switch 506 and the first little tri-state switch 502 are in the on current-flow state. The second little tri-state switch 504 and the second big bi-state switch 508 are both in the off current-flow state. Because the origin power source has a lower voltage level than the destination power source, the first little tri-state switches 502 are to be placed in the one-way current-flow state during the power rail transition procedure 900.

In the first phase ($t_1$), the first big bi-state switch 506 is converted to the off current-flow state, and the first little tri-state switch 502 is converted to the one-way current-flow state. The first phase proceeds from left-to-right with the tile control circuit 310 in each power-multiplexer tile 110 performing both conversions in a single pass across the chained arrangement. Alternatively, two passes may be employed. At the last power-multiplexer tile 110-10, after the tile control circuit 310 converts the first big bi-state switch 506 to the off current-flow state and the first little tri-state switch 502 to the one-way current-flow state, the second phase ($t_2$) is started.

As indicated at the lower right corner of FIG. 9, the second phase starts at the last power-multiplexer tile 110-10 and proceeds in the reverse direction from right-to-left. This direction reversal is also discussed above with reference to the thick dashed-and-solid arrow 218 of FIG. 2. In the second phase, the second little tri-state switch 504 is converted to the on current-flow state. With reference to FIG. 10, the complete chained arrangement of power-multiplexer tiles is shown for the second phase ($t_2$). The conversion of the second little tri-state switch 504 to the on current-flow state proceeds from the "last" power-multiplexer tile 110-10 and concludes at the "first" power-multiplexer tile 110-1. The second phase is performed sequentially so that the current in-rush from the destination power rail is managed by incrementally increasing the current flowing to the circuit load via the virtual power rail. In the example power rail transition procedure 900, the second phase is an overlapping phase in which the circuit load is powered by current flowing from both the origin power rail and the destination power rail. However, the one-way current-flow state of the first little tri-state switches 502 prevents cross conduction between the origin power rail and the destination power rail.

In the third phase ($t_3$), which reverses direction again to proceed from left-to-right, the first little tri-state switch 502 is converted to the off current-flow state. The conversions of the first little tri-state switches 502 of the multiple power-multiplexer tiles 110-1 to 110-10 may be performed sequentially or in a fully or partially parallel manner. In the fourth phase ($t_4$), the power-multiplexer control circuitry 210 converts the second big bi-state switch 508 in each power-multiplexer tile 110 to the on current-flow state. The fourth phase may proceed from right-to-left by reversing the direction of the third phase in a sequential manner to further manage the current in-rush from the big switches. Alternatively, the turning on of the second big bi-state switches 508 may be accelerated by performing the conversions at least partially simultaneously.

FIGS. 11 and 12 illustrate a first portion 1100-1 and a second portion 1100-2, respectively, of the example power rail transition procedure 1100 for an origin power source having a higher voltage level than a destination power source. In the initial phase ($t_0$), the first big bi-state switch 506 and the first little tri-state switch 502 are in the on current-flow state. The second little tri-state switch 504 and the second big bi-state switch 508 are both in the off current-flow state. Because the destination power source has a lower voltage level than the origin power source, the second little tri-state switches 504 are to be placed in the one-way current-flow state during the power rail transition procedure 1100.

In the first phase ($t_1$), the first big bi-state switch 506 is converted to the off current-flow state, and the second little tri-state switch 504 is converted to the one-way current-flow state. The first phase proceeds from left-to-right with the tile control circuit 310 performing the conversions on both switches in a single pass. At least the conversions of the second little tri-state switches 504 are performed sequentially to manage current in-rush and protect the destination power rail from an appreciable voltage droop. In the example power rail transition procedure 1100, the first phase is an overlapping phase in which the circuit load is powered by current flowing from both the origin power rail and the destination power rail. However, the one-way current-flow state of the second little tri-state switches 504 prevents cross conduction between the origin power rail and the destination power rail.

In the second phase ($t_2$), the first little tri-state switch 502 is converted to the off current-flow state. The conversions of the first little tri-state switches 502 of the multiple power-multiplexer tiles 110-1 to 110-10 may be performed sequentially or in a fully or partially parallel manner. In one example, operation of the tile control circuits 310 to perform the conversions starts at the first power-multiplexer tile 110-1 and ends at the last power-multiplexer tile 110-10. As indicated at the lower right corner of FIG. 11, the last power-multiplexer tile 110-10 performs the conversion of the second phase and then performs the conversion of the third phase ($t_3$) to reverse the direction of the power rail transition procedure. At the top right corner of FIG. 12, the second portion 1100-2 depicts a conversion of the second little tri-state switch 504 from the one-way current-flow state to the on current-flow state to start the third phase.

In the third phase, the second little tri-state switch 504 is converted to the on current-flow state from right-to-left in each of the power-multiplexer tiles. In the fourth phase ($t_4$), the power-multiplexer control circuitry 210 converts the second big bi-state switch 508 in each power-multiplexer tile 110 to the on current-flow state to provide more current to the circuit load. The fourth phase may proceed from left-to-right by reversing the direction of the third phase in a sequential manner to further manage the current in-rush due to the larger size of the big switches. Alternatively, the turning on of the second big bi-state switches 508 may be accelerated by performing the conversions at least partially simultaneously.

The phases of the example power rail transition procedures 900 and 1100 are described above in specific sequential orders. However, a given phase may be performed in a sequential order having a different direction or in a non-sequential order. Furthermore, a given phase may be performed by using separate passes along a chained arrangement of power-multiplexer tiles for each switch type being converted instead of a combined pass for multiple switch types.

Figure 13:
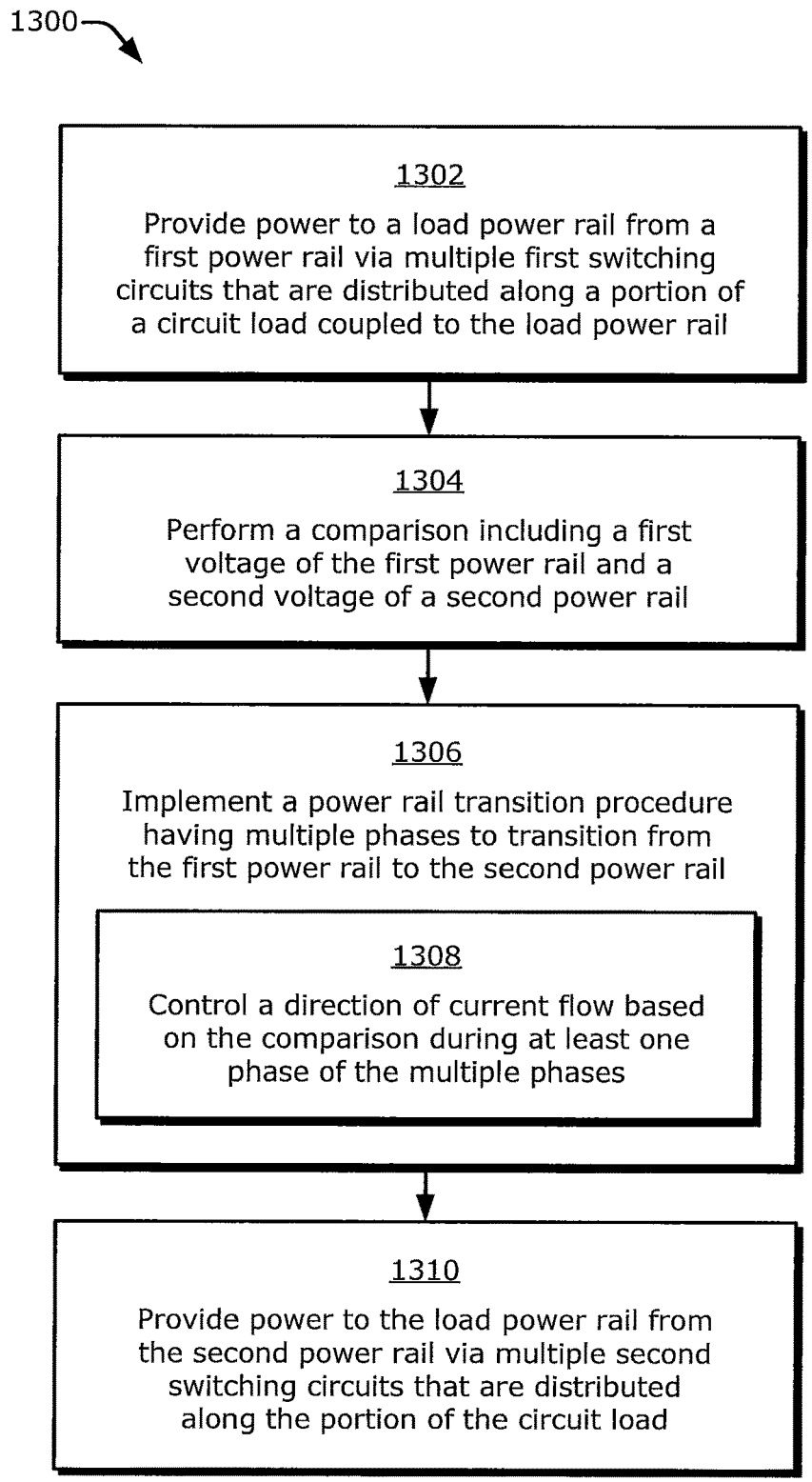
FIG. 13 is a flow diagram illustrating an example process for adaptive power multiplexing with a power distribution network.

FIG. 13 is a flow diagram illustrating an example process 1300 for adaptive power multiplexing with a power distribution network. The process 1300 is described in the form of a set of blocks 1302-1310 that specify operations that can be performed. However, operations are not necessarily limited to the order shown in FIG. 13 or described herein, for the operations may be implemented in alternative orders or in fully or partially overlapping manners. Operations represented by the illustrated blocks of the process 1300 may be performed by an integrated circuit, such as the integrated circuit 100 of FIG. 1 or the integrated circuit 1410 of FIG. 14, which is described below. More specifically, the operations of the process 1300 may be performed by the chained arrangement 200 of multiple power-multiplexer tiles 110-1 to 110-10 in conjunction with the power-multiplexer control circuitry 210 of FIG. 2.

At block 1302, power is provided to a load power rail from a first power rail via multiple first switching circuits that are distributed along a portion of a circuit load coupled to the load power rail. For example, an integrated circuit 100 can provide power to a load power rail 106 from a first power rail 102 via multiple first switching circuits 212 that are distributed along a portion of a circuit load 108 coupled to the load power rail 106. For instance, current may flow from the first power rail 102 to the load power rail 106 via the multiple first switching circuits 212 that are in an on current-flow mode. Within a given first switching circuit 212, a first little tri-state switch 502 and a first big bi-state switch 506 may both initially be in an on current-flow state.

At block 1304, a relative voltage signal is generated based on a comparison including a first voltage of the first power rail and a second voltage of a second power rail. For example, an integrated circuit 100 can generate a relative voltage signal 304 based on a comparison including a first voltage 202 of the first power rail 102 and a second voltage 204 of a second power rail 104. This comparison may be performed by a comparator 302 that receives as input the first voltage 202 and the second voltage 204 and produces as output the relative voltage signal 304, which is indicative of a voltage difference between the first voltage 202 and the second voltage 204, such as a Boolean value representative of which voltage is less than or greater than the other voltage.

At block 1306, a power rail transition procedure having multiple phases is implemented to transition from the first power rail to the second power rail. For example, an integrated circuit 100 can implement a power rail transition procedure 900 or 1100 having multiple phases ($t_0$-$t_4$) to transition from the first power rail 102 to the second power rail 104. To do so, power-multiplexer control circuitry 210 may control the current-flow modes of the multiple first switching circuits 212 and multiple second switching circuits 214. The power-multiplexer control circuitry 210 may direct each first switching circuit 212 to disconnect the first power rail 102 from the load power rail 106 and direct each second switching circuit 214 to connect the second power rail 104 to the load power rail 106 in an orderly fashion at a level of individual switches. The power rail transitioning may be accomplished by making repeated passes across a chained arrangement of the multiple first switching circuits 212 and the multiple second switching circuits 214 to establish different current-flow modes for the switching circuits by converting the current-flow states of the individual switches that form the switching circuits.

Implementation of the power rail transition procedure includes, at block 1308, controlling a direction of current flow based on the relative voltage signal during at least one phase of the multiple phases. For example, an integrated circuit 100 can control a direction of current flow (e.g., to or from a given power supply rail) based on the relative voltage signal 304 during at least one phase of the multiple phases ($t_0$-$t_4$). The power-multiplexer control circuitry 210 may institute an overlapping phase in which current can flow to the load power rail 106 from both the first power rail 102 and the second power rail 104 by directing current flow toward the load power rail 106 using at least one switch that is placed in a one-way current-flow state. A determination of which switching circuit has a switch that is to be placed in the one-way current-flow state is made based on the relative voltage signal 304 such that current is prevented from flowing toward the power supply rail having the lower voltage between the first power rail 102 and the second power rail 104. If the first voltage 202 is less than the second voltage 204, for instance, the first little tri-state switch 502 of each first switching circuit 212 may be placed in the one-way current-flow state while the multiple second switching circuits 214 are being turned on.

At block 1310, power is provided to the load power rail from the second power rail via multiple second switching circuits that are distributed along the portion of the circuit load. For example, an integrated circuit 100 can provide power to the load power rail 106 from the second power rail 104 via multiple second switching circuits 214 that are distributed along the portion of the circuit load 108. Current may flow from the second power rail 104 to the load power rail 106 via the multiple second switching circuits 214 that are in an on current-flow mode as a result of the power rail transition procedure 900 or 1100. To fully supply the circuit load 108 with current, both a second little tri-state switch 504 and a second big bi-state switch 508 may eventually be activated in the on current-flow state within each second switching circuit 214.

Figure 14:
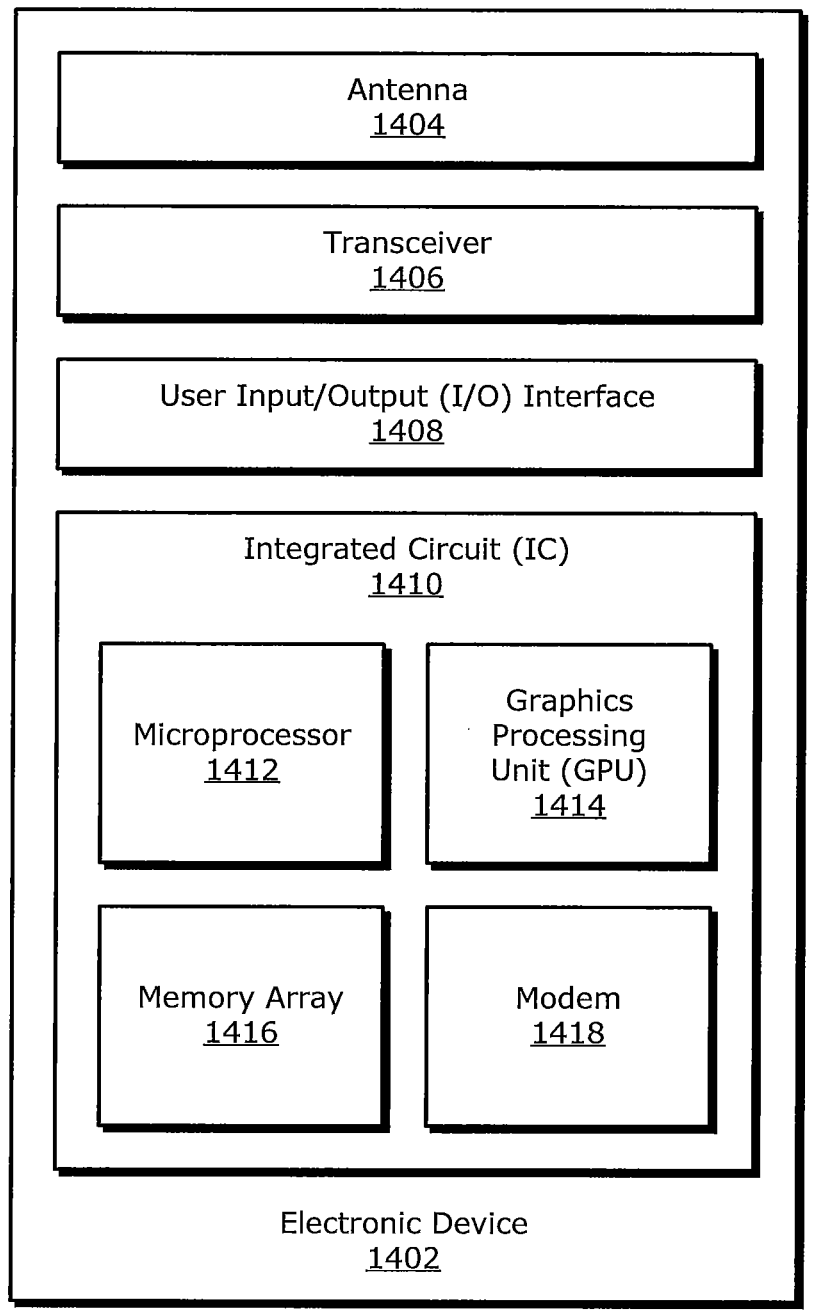
FIG. 14 illustrates an example electronic device that includes an integrated circuit having multiple cores.

FIG. 14 depicts an example electronic device 1402 that includes an integrated circuit (IC) 1410 having multiple cores. As shown, the electronic device 1402 includes an antenna 1404, a transceiver 1406, and a user input/output (I/O) interface 1408 in addition to the integrated circuit 1410. Illustrated examples of the integrated circuit 1410, or cores thereof, include the microprocessor 1412, a graphics processing unit (GPU) 1414, the memory array 1416, and a modem 1418. In one or more embodiments, power management techniques as described herein can be implemented by the integrated circuit 1410.

The electronic device 1402 can be a mobile or battery-powered device or a fixed device that is designed to be powered by an electrical grid. Examples of the electronic device 1402 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1402 can also be a device, or a portion thereof, having embedded electronics. Examples of the electronic device 1402 with embedded electronics include a passenger vehicle, industrial equipment, a refrigerator or other home appliance, a drone or other unmanned aerial vehicle (UAV), or a power tool.

For an electronic device with a wireless capability, the electronic device 1402 includes an antenna 1404 that is coupled to a transceiver 1406 to enable reception or transmission of one or more wireless signals. The integrated circuit 1410 may be coupled to the transceiver 1406 to enable the integrated circuit 1410 to have access to received wireless signals or to provide wireless signals for transmission via the antenna 1404. The electronic device 1402 as shown also includes at least one user I/O interface 1408. Examples of the user I/O interface 1408 include a keyboard, a mouse, a microphone, a touch-sensitive screen, a camera, an accelerometer, a haptic mechanism, a speaker, a display screen, or a projector.

The integrated circuit 1410 may comprise, for example, one or more instances of a microprocessor 1412, a GPU 1414, a memory array 1416, a modem 1418, and so forth. The microprocessor 1412 may function as a central processing unit (CPU) or other general-purpose processor. Some microprocessors include different parts, such as multiple processing cores, that may be individually powered on or off. The GPU 1414 may be especially adapted to process visual-related data for display. If visual-related data is not being rendered or otherwise processed, the GPU 1414 may be fully or partially powered down. The memory array 1416 stores data for the microprocessor 1412 or the GPU 1414. Example types of memory for the memory array 1416 include random access memory (RAM), such as dynamic RAM (DRAM) or static RAM (SRAM); flash memory; and so forth. If programs are not accessing data stored in memory, the memory array 1416 may be powered down overall or block-by-block. The modem 1418 demodulates a signal to extract encoded information or modulates a signal to encode information into the signal. If there is no information to decode from an inbound communication or to encode for an outbound communication, the modem 1418 may be idled to reduce power consumption. The integrated circuit 1410 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1410 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1410 generally, may be termed cores or circuit blocks. A core or circuit block of an SOC may be powered down if not in use, such as by undergoing a power collapse or being multiplexed onto a power rail having a lower voltage level, according to the techniques described in this document. Examples of cores or circuit blocks include, in addition to those that are illustrated in FIG. 14, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a processing or GPU core, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising: a first power rail;
a second power rail;
a load power rail;
multiple power-multiplexer tiles coupled in series in a chained arrangement and configured to jointly perform a power-multiplexing operation, each power-multiplexer tile configured to switch between coupling the load power rail to the first power rail and coupling the load power rail to the second power rail; and
power-multiplexer control circuitry configured to control a direction of current flow to prevent cross-conduction between the first power rail and the second power rail during the power-multiplexing operation;
wherein each power-multiplexer tile of the multiple power-multiplexer tiles comprises:
a first switching circuit coupled between the first power rail and the load power rail, the first switching circuit configured to connect the first power rail to the load power rail or to disconnect the first power rail from the load power rail; and
a second switching circuit coupled between the second power rail and the load power rail, the second switching circuit configured to connect the second power rail to the load power rail or to disconnect the second power rail from the load power rail, and
wherein the first switching circuit comprises a first tri-state switch coupled between the first power rail and the load power rail, the first tri-state switch configured to selectively enter an off state to bi-directionally block current flow between the first power rail and the load power rail, an on state to enable bidirectional current flow between the first power rail and the load power rail, and a one-way state to permit unidirectional current flow from the first power rail to the load power rail and to prevent unidirectional current flow from the load power rail to the first power rail.

2. The integrated circuit of claim 1, further comprising:
a circuit load coupled to the load power rail,
wherein the power-multiplexer control circuitry is further configured to overlap the coupling of the load power rail to the first power rail and the coupling of the load power rail to the second power rail to continuously provide power to the circuit load via at least one of the first power rail or the second power rail during the power-multiplexing operation.

3. The integrated circuit of claim 1, further comprising:
a comparator coupled to the first power rail and the second power rail, the comparator configured to produce a relative voltage signal based on a first voltage of the first power rail and a second voltage of the second power rail,
wherein the power-multiplexer control circuitry is further configured to perform the power-multiplexing operation based on the relative voltage signal.

4. The integrated circuit of claim 1, wherein the first tri-state switch comprises a diode-connected transistor configurable to be selectively operated as a diode that permits unidirectional current flow.

5. The integrated circuit of claim 1, wherein:
the first tri-state switch comprises a first little tri-state switch; and the first switching circuit further comprises a first big bi-state switch coupled in parallel with the first little tri-state switch between the first power rail and the load power rail, the first big bi-state switch configured to selectively enter the off state to bi-directionally block current flow between the first power rail and the load power rail and the on state to enable bidirectional current flow between the first power rail and the load power rail, wherein the first big bi-state switch is physically larger than the first little tri-state switch and is configured to conduct a larger current.

6. The integrated circuit of claim 1, wherein:

the first tri-state switch comprises a first little tri-state switch; and the first switching circuit further comprises a first little bi-state switch coupled in series with the first little tri-state switch between the first power rail and the load power rail, wherein the first little bi-state switch is configured to reduce a leakage current of the first little tri-state switch.

7. The integrated circuit of claim 1, wherein the power-multiplexer control circuitry comprises:

multiple tile control circuits, a respective tile control circuit coupled between the first switching circuit and the second switching circuit of each respective power-multiplexer tile, each respective tile control circuit configured to place the first switching circuit and the second switching circuit into different current-flow modes during a power rail transition procedure based on a relative voltage signal that is indicative of a voltage difference between a first voltage of the first power rail and a second voltage of the second power rail.

8. The integrated circuit of claim 1, wherein the power-multiplexer control circuitry comprises inter-tile signal propagation circuitry configured to forward a continue power rail transition signal from one power-multiplexer tile of the multiple power-multiplexer tiles to a consecutive power-multiplexer tile along the chained arrangement such that a connection portion of a power-multiplexing operation proceeds sequentially along the chained arrangement.

9. An integrated circuit comprising: a first power rail;
a second power rail;
a load power rail;
multiple power-multiplexer tiles coupled in series in a chained arrangement and configured to jointly perform a power-multiplexing operation, each power-multiplexer tile configured to switch between coupling the load power rail to the first power rail and coupling the load power rail to the second power rail; and
power-multiplexer control circuitry configured to control a direction of current flow to prevent cross-conduction between the first power rail and the second power rail during the power-multiplexing operation, wherein each power-multiplexer tile of the multiple power-multiplexer tiles comprises:
a first switching circuit coupled between the first power rail and the load power rail, the first switching circuit configured to connect the first power rail to the load power rail or to disconnect the first power rail from the load power rail; and
a second switching circuit coupled between the second power rail and the load power rail, the second switching circuit configured to connect the second power rail to the load power rail or to disconnect the second power rail from the load power rail, and wherein the first switching circuit and the second switching circuit are both configured to operate in accordance with three current-flow modes, the three current-flow modes including an off mode to bi-directionally block current flow, an on mode to enable bidirectional current flow, and a one-way mode to permit unidirectional current flow, wherein the power-multiplexer control circuitry is configured to control a power rail transition procedure of the power-multiplexing operation such that: (1) if a first voltage of the first power rail is less than a second voltage of the second power rail, the first switching circuit is placed in the one-way mode to permit unidirectional current flow and the second switching circuit is placed in the on mode to enable bidirectional current flow during an overlapping phase of the power rail transition procedure; and (2) if the second voltage is less than the first voltage, the second switching circuit is placed in the one-way mode to permit unidirectional current flow and the first switching circuit is placed in the on mode to enable bidirectional current flow during the overlapping phase of the power rail transition procedure.

10. An integrated circuit comprising:
a first power rail;
a second power rail;
a load power rail;
multiple power-multiplexer tiles coupled in series in a chained arrangement and configured to perform a power-multiplexing operation including switching between coupling the load power rail to the first power rail and coupling the load power rail to the second power rail, the power-multiplexing operation including an overlapping phase in which the first power rail and the second power rail are both coupled to the load power rail; and
means for preventing cross-conduction between the first power rail and the second power rail during the overlapping phase of the power-multiplexing operation by controlling a direction of current flow;
means for transitioning between the first power rail and the second power rail during the power-multiplexing operation by instituting an overlapping phase in which current can flow to the load power rail from both the first power rail and the second power rail and, wherein:
a first voltage of the first power rail is less than a second voltage of the second power rail; and
the means for preventing cross-conduction between the first power rail and the second power rail comprises:
means for placing a first switching circuit in each power-multiplexer tile of the multiple power-multiplexer tiles in a one-way mode to permit unidirectional current flow from the first power rail to the load power rail and to prevent unidirectional current flow from the load power rail to the first power rail as part of the overlapping phase of the power-multiplexing operation; and
means for placing a second switching circuit in each power-multiplexer tile in an on mode to enable bidirectional current flow between the second power rail and the load power rail.

11. The integrated circuit of claim 10, wherein each power-multiplexer tile of the multiple power-multiplexer tiles comprises:

first means for establishing current-flow modes between the first power rail and the load power rail during the power-multiplexing operation; and second means for establishing current-flow modes between the second power rail and the load power rail during the power-multiplexing operation.

12. The integrated circuit of claim 11, wherein:

the first means for establishing the current-flow modes includes first tri-state means for entering a current-flow state selected from an on state, an off state, and a one-way state, the one-way state configured to direct current flow from the first power rail to the load power rail; and the second means for establishing the current-flow modes includes second tri-state means for entering a current-flow state selected from an on state, an off state, and a one-way state, the one-way state configured to direct current flow from the second power rail to the load power rail.

13. The integrated circuit of claim 10 further comprising:

a circuit load coupled to the load power rail; and means for providing power continuously to the circuit load via at least one of the first power rail or the second power rail during the power-multiplexing operation.

14. The integrated circuit of claim 10, wherein:

for a power rail transition procedure of the power-multiplexing operation, the first power rail comprises an origin power rail, and the second power rail comprises a destination power rail; and the means for transitioning between the first power rail and the second power rail comprises means for sequentially connecting the load power rail to the second power rail along the chained arrangement of the multiple power-multiplexer tiles.

15. A method for adaptive power multiplexing with a power distribution network, the method comprising:

providing power to a load power rail from a first power rail via multiple first switching circuits that are distributed along a portion of a circuit load coupled to the load power rail;

generating a relative voltage signal based on a comparison including a first voltage of the first power rail and a second voltage of a second power rail;

implementing a power rail transition procedure having multiple phases to transition from the first power rail to the second power rail, including controlling a direction of current flow based on the relative voltage signal during at least one phase of the multiple phases; and providing power to the load power rail from the second power rail via multiple second switching circuits that are distributed along the portion of the circuit load, wherein the implementing the power rail transition procedure comprises:

if the relative voltage signal indicates that the first voltage is less than the second voltage, converting the multiple first switching circuits from an on current-flow mode to a one-way current-flow mode in a first phase of the power rail transition procedure, the one-way current-flow mode permitting a unidirectional current flow from the first power rail to the load power rail and preventing a unidirectional current flow from the load power rail to the first power rail;

converting the multiple second switching circuits from an off current-flow mode to the on current-flow mode in a second phase of the power rail transition procedure; and converting the multiple first switching circuits from the one-way current-flow mode to the off current-flow mode in a third phase of the power rail transition procedure and, wherein the converting the multiple first switching circuits from the on current-flow mode to the one-way current-flow mode in the first phase comprises:

placing a first big bi-state switch in an off state to bi-directionally block current flow in each first switching circuit of the multiple first switching circuits; and placing a first little tri-state switch in a one-way state to permit unidirectional current flow in each first switching circuit of the multiple first switching circuits.

16. The method of claim 15, wherein the converting the multiple first switching circuits from the one-way current-flow mode to the off current-flow mode in the third phase comprises placing the first little tri-state switch in the off state to bi-directionally block current flow in each first switching circuit of the multiple first switching circuits.

17. The method of claim 15, wherein the converting the multiple second switching circuits from the off current-flow mode to the on current-flow mode in the second phase comprises converting the multiple second switching circuits from the off current-flow mode to the on current-flow mode in a sequential order along a chained arrangement of multiple power-multiplexer tiles that each respectively include one of the multiple second switching circuits.

18. The method of claim 15, wherein:

the converting the multiple second switching circuits from the off current-flow mode to the on current-flow mode in the second phase comprises placing a second little tri-state switch in an on state to enable bidirectional current flow in each second switching circuit of the multiple second switching circuits; and the implementing the power rail transition procedure further includes placing a second big bi-state switch in an on state in each second switching circuit of the multiple second switching circuits in a fourth phase of the power rail transition procedure to increase bidirectional current flow.

19. The method of claim 15 wherein the implementing the power rail transition procedure comprises:

if the relative voltage signal indicates that the second voltage is less than the first voltage, converting the multiple second switching circuits from an off current-flow mode to a one-way current-flow mode in a first phase of the power rail transition procedure, the one-way current-flow mode permitting a unidirectional current flow from the second power rail to the load power rail and preventing a unidirectional current flow from the load power rail to the second power rail;

converting the multiple first switching circuits from an on current-flow mode to the off current-flow mode in a second phase of the power rail transition procedure; and converting the multiple second switching circuits from the one-way current-flow mode to the on current-flow mode in a third phase of the power rail transition procedure.

20. An integrated circuit comprising:

a first power rail configured to be held at a first voltage;

a second power rail configured to be held at a second voltage;

a load power rail;

a power-multiplexer tile including:

a first big bi-state switch coupled between the first power rail and the load power rail;

a first little tri-state switch coupled between the first power rail and the load power rail, the first little tri-state switch capable of being in a one-way state to permit unidirectional current flow from the first power rail to the load power rail and to prevent unidirectional current flow from the load power rail to the first power rail;

a second big bi-state switch coupled between the second power rail and the load power rail; and a second little tri-state switch coupled between the second power rail and the load power rail, the second little tri-state switch capable of being in the one-way state to permit unidirectional current flow from the second power rail to the load power rail and to prevent unidirectional current flow from the load power rail to the second power rail; and power-multiplexer control circuitry configured to place the first little tri-state switch or the second little tri-state switch in the one-way state based on a comparison including the first voltage and the second voltage during a power-multiplexing operation to switch between coupling the load power rail to the first power rail and coupling the load power rail to the second power rail, wherein:

the first big bi-state switch comprises a first big transistor;

the first little tri-state switch comprises a first little transistor that is connected in a diode configuration, the first big transistor being physically larger than the first little transistor;

the second big bi-state switch comprises a second big transistor; and the second little tri-state switch comprises a second little transistor that is connected in a diode configuration, the second big transistor being physically larger than the second little transistor.

21. An integrated circuit comprising:

a first power rail configured to be held at a first voltage;

a second power rail configured to be held at a second voltage;

a load power rail;

a power-multiplexer tile including:

a first big bi-state switch coupled between the first power rail and the load power rail;

a first little tri-state switch coupled between the first power rail and the load power rail, the first little tri-state switch capable of being in a one-way state to permit unidirectional current flow from the first power rail to the load power rail and to prevent unidirectional current flow from the load power rail to the first power rail;

a second big bi-state switch coupled between the second power rail and the load power rail; and a second little tri-state switch coupled between the second power rail and the load power rail, the second little tri-state switch capable of being in the one-way state to permit unidirectional current flow from the second power rail to the load power rail and to prevent unidirectional current flow from the load power rail to the second power rail; and power-multiplexer control circuitry configured to place the first little tri-state switch or the second little tri-state switch in the one-way state based on a comparison including the first voltage and the second voltage during a power-multiplexing operation to switch between coupling the load power rail to the first power rail and coupling the load power rail to the second power rail, wherein the power-multiplexer control circuitry is further configured to:

implement a power rail transition procedure across a chained arrangement of multiple power-multiplexer tiles;

continuously provide power to a circuit load coupled to the load power rail via at least one of the first power rail or the second power rail during the power rail transition procedure; and cause the first little tri-state switch or the second little tri-state switch to be in the one-way state based on the comparison such that cross-conduction between the first power rail and the second power rail is prevented during the power rail transition procedure.

* * * * *